United States Patent [19]
Miyasaka

[11] Patent Number: 5,510,146
[45] Date of Patent: Apr. 23, 1996

[54] CVD APPARATUS, METHOD OF FORMING SEMICONDUCTOR FILM, AND METHOD OF FABRICATING THIN-FILM SEMICONDUCTOR DEVICE

[75] Inventor: Mitsutoshi Miyasaka, Suwa, Japan

[73] Assignee: Seiko Epson Corporation, Japan

[21] Appl. No.: 27,175

[22] PCT Filed: Jul. 14, 1992

[86] PCT No.: PCT/JP92/00898

§ 371 Date: Mar. 16, 1993

§ 102(e) Date: Mar. 16, 1993

[87] PCT Pub. No.: WO93/02468

PCT Pub. Date: Feb. 4, 1993

[30] Foreign Application Priority Data

| Jul. 16, 1991 | [JP] | Japan | 3-175393 |
| Sep. 12, 1991 | [JP] | Japan | 3-233407 |
| Oct. 30, 1991 | [JP] | Japan | 3-284360 |
| May 14, 1992 | [JP] | Japan | 4-122135 |

[51] Int. Cl.$^6$ .................................. C23C 16/00
[52] U.S. Cl. .................. 427/255; 427/255.3; 427/255.5; 427/255.7; 437/409; 118/715; 118/720
[58] Field of Search .................. 427/255, 255.1, 427/255.3, 255.5, 255.7, 58, 96, 578; 437/109; 118/720, 715

[56] References Cited

U.S. PATENT DOCUMENTS

| 3,670,172 | 6/1972 | Golden | 250/43.5 R |
| 3,924,137 | 12/1975 | Alger | 250/499 |
| 3,924,967 | 12/1975 | Harra | 417/51 |
| 4,475,045 | 10/1984 | Holden et al. | 250/492.2 |
| 4,636,401 | 1/1987 | Yamazaki et al. | 427/39 |
| 4,640,844 | 2/1987 | Neppl et al. | 427/255.7 |
| 4,758,529 | 7/1988 | Ipri | 427/255 |
| 4,842,897 | 6/1989 | Takeuchi et al. | 427/255 |
| 4,868,014 | 9/1989 | Kanai et al. | 427/255 |
| 4,900,694 | 2/1990 | Nakagawa | 437/109 |
| 4,956,204 | 9/1990 | Amazawa et al. | 427/255 |
| 5,026,574 | 6/1991 | Economu et al. | 427/255 |
| 5,064,779 | 11/1991 | Hasegawa | 437/109 |
| 5,091,219 | 2/1992 | Monkowski et al. | 427/255.7 |
| 5,143,018 | 9/1992 | Meakin | 118/715 |
| 5,234,724 | 8/1993 | Schmidt | 427/530 |
| 5,298,452 | 3/1994 | Meyerson | 437/81 |

FOREIGN PATENT DOCUMENTS

| 63-46777 | 2/1988 | Japan . |
| 64-66964 | 3/1989 | Japan . |

OTHER PUBLICATIONS

Leybold, Product & Vacuum Technology Reference book, 1991, p. 5.
Hatsumei Kyokai Open Technical Report No. 90-10440; Journal Of Technical Disclosure; vol. 15-34.
Donahue Et Al.; Nikkei Microdevices; Oct. 1985, pp. 79-87.
Preliminary Manuscripts For The 26th Applied Physics Relates Combination Lecture, (1979, Mar. 27).
Iscoff; Nikkei Microdevices; Apr. 1986, pp. 131-143.
Aoyama Et Al; "Crystallization Of LPCVD Silicon Films By Low Temperature Annealing": J. Electrochem. Soc., vol. 136, No. 4, Apr. 1989, pp. 1169-1173.

(List continued on next page.)

Primary Examiner—Shrive Beck
Assistant Examiner—Brian K. Tallot
Attorney, Agent, or Firm—Oliff & Berridge

[57] ABSTRACT

A semiconductor film and a thin-film semiconductor device are produced by a simple low-pressure process. To improve the quality, when they are produced during the low-pressure process, a semiconductor film forming a channel portion is deposited by a low-pressure CVD apparatus whose effective pumping speed inside a reaction chamber is in excess of 10 SCCM/mtorr or which reduces the pressure inside the reaction chamber below $10^{-5}$ torr within 10 minutes after a vacuum-pumping machine is started to be operated steadily. This improves the semiconductor characteristics, the productivity, and can lower the process temperature.

33 Claims, 14 Drawing Sheets

OTHER PUBLICATIONS

Serikawa et al.; "Electrical Characteristics Of High-Mobility Fine-Grain Poly-SI TFTS From Laser Irradiated Sputter-Depsoited SI Film": Japanese Journal Of Applied Physics, vol. 28, No. 11, Nov. 1989, pp. L1871-L1873.

Migliorato Et Al.; "Material Properties And Characteristics Of Polysilicon Transistors For Large Area Electronics"; Applied Surface Sciences 30 (1987); pp. 353-371.

Meakin Et Al; "Low Defect-Density Polycrystalline Silicon For High Performance Thin Film Transistors": Applied Surface Science 30 (1987) pp. 372-382.

Miyasaka Et Al.: "TFT and Physical Properties Of Poly--Crystalline Silicon Prepared By Very Low Pressure Chemical Vapor Deposition (VLPCVD)"; Extended Abstracts Of The 1991 International Conference On Solid State Devices And Materials, Yokohama, 1991, pp. 614-616.

Mitsutoshi Miyasaka et al., "TFT and Physical Properties of Poly-Crystalline Silicon Prepared by Very Low Pressure Chemical Vapour Deposition (VLPCVD)"; *Japanese Journal of Applied Physics*, vol. 30, No. 12B, Dec. 1991, pp. 3733-3740.

Mitsutoshi Miyasaka et al., "Transistor and physical properties of polycrystalline silicon films prepared by infralow--pressure chemical vapor deposition", *J. Appl. Phys* 74 (4), 15 Aug. 1993; pp. 2870-2885.

Meakin, D. et al, "The Growth of Polycrystalline Silicon Films By Low Pressure Chemical Vapour Deposition at Relatively Low Temperatures", *Thin Solid Films*, 163 (1988) 249-254.

Loisel, B. et al, "LPCVD Silicon For Active Devices", *Journal De Physique,* Colloque C5, supplement au n°5, vol. 50, May 1989, C5-467-C5-477.

Ahmed, et al, "The Growth of Polycrystalline Silicon By Ultra Low Pressure Chemical Vapour Deposition", 445-456.

CVD APPARATUS, METHOD OF FORMING SEMICONDUCTOR FILM, AND METHOD OF FABRICATING THIN-FILM SEMICONDUCTOR DEVICE

BACKGROUND

1. Field of the Invention

The present invention relates to a method of forming a semiconductor film such as a silicon film used in a thin-film semiconductor device, integrated circuit, solar cell, charge-coupled device, or other device. The invention also relates to a low-pressure chemical vapor deposition apparatus used to form a semiconductor film and also to a thin-film semiconductor device which employs a semiconductor film and can be applied to an active-matrix liquid crystal display.

2. Description of Related Art

In recent years, liquid-crystal displays having larger viewing screens and higher resolution have been manufactured. With this trend the driving method has shifted from the simple matrix method to the active-matrix method to provide a display having a larger amount of information. The active-matrix method permits the fabrication of a liquid-crystal display having hundreds of thousands of pixels. In this liquid-crystal display, a switching transistor is provided for each pixel. Molten quartz plates and transparent insulating plates made of glass or other material are used as the front and back plates of various liquid-crystal displays. The transparent insulating plates enable the fabrication of transmission-type display devices.

However, in order to increase the area of the viewing screen or to reduce the cost, it is essential to use cheap, normal glass as insulating plates or substrates. Therefore, there is a demand for a technique capable of forming thin-film transistors operating stably on inexpensive glass plates which activate an active-matrix liquid crystal display while maintaining economical merit.

Usually, semiconductor films such as amorphous silicon films or polycrystalline silicon films are used as the active layers of thin-film transistors. When driver circuits are integrated with thin-film transistors, the use of polysilicon is advantageous, because it offers a high operating speed.

In order to make such devices, a technique is required for fabricating a thin-film semiconductor device having a normal glass plate on which an active layer consisting of a semiconductor film such as a polysilicon film is formed. Where normal glass plates are used, a great restriction is imposed on the process. In particular, the maximum temperature must be below about 600° C., i.e., below the strain point of the glass. Therefore, there is a demand for a low-temperature processing technique for fabricating thin-film transistors capable of operating a liquid-crystal display and the active layer of thin-film transistors capable of operating driver circuits at a high speed.

One conventional LPCVD (low-pressure chemical vapor deposition) method of depositing such a semiconductor film uses an LPCVD system in which the lowest attainable base pressure is $10^{-3}$ to $10^{-4}$ torr. The deposition pressure is set above approximately 40 mtorr by the system. A semiconductor film such as a silicon film is deposited by elevating temperature to 610°–640° C. which is equal to or slightly higher than the strain point of the glass. Another LPCVD method makes use of an LPCVD system having a reaction chamber which is evacuated at an effective pumping speed of about 1 to 3 SCCM/mtorr or less. The deposition temperature is elevated to the maximum permissible temperature of approximately 600° to 620° C. at which the glass plates or substrates can be used. Monosilane ($SiH_4$) is supplied as a raw material gas at a flow rate of about 10 SCCM (Standard Cubic Centimeters per Minute). The partial pressure of the monosilane is set to about several millitorr. Under this condition, a semiconductor film such as a silicon film is deposited (see *Solid State Devices and Materials,* 1991, Extended Abstracts, p. 614).

A further method of forming a semiconductor layer acting as an active layer is described in Japanese Patent Laid-Open No. 307776/1988. In particular, a semiconductor film such as a silicon film which will become the active layer is deposited on an insulating substrate at a temperature lower than 570° C. by low-pressure CVD. Then, the substrate is thermally treated at a temperature lower than 640° C. for about 24 hours to form a crystallized semiconductor film, thus improving the characteristics of the thin-film transistors.

Yet other methods use rf magnetron sputtering or plasma-enhanced CVD. In particular, an amorphous silicon film is deposited at a temperature below about 300° C. by the magnetron sputtering or plasma-enhanced CVD. Then, the film is illuminated with various laser radiations to form a silicon film acting as the active layer of a thin-film transistor (*Jpn. J. Appl. Phys.* 28, p. 1871 (1989); and Research Report EID-88-58, *Institute of Electronics and Information Communication Engineers*).

These prior art techniques have various drawbacks. In the second method of thermally treating the substrate after silicon film is deposited, the thermal treatment temperature is too high to use glass plates. If this annealing temperature is lowered below about 600° C., the processing time is as long as tens of hours. This also inhibits the use of glass plates. In addition, the manufacturing process is redundant compared with the first-mentioned LPCVD method. As a result, the productivity is decreased, and the price of the commercial product is increased. In the method using laser illumination after a silicon film is deposited, the semiconductor characteristics vary greatly from device to device. This makes it impossible to form a number of thin-film semiconductor devices uniformly in a large area. Additionally, the manufacturing process is more complex and more redundant than the first-mentioned LPCVD process, in the same way as the second-mentioned method. Hence, the productivity is low. Also, expensive processing equipment must be purchased. Furthermore, the cost is increased. Accordingly, various problems are associated with these processes.

On the other hand, where the prior art LPCVD is utilized to form a semiconductor film such as a silicon film, the deposition apparatus and deposition techniques are not yet advanced. Therefore, if such a semiconductor film is used as an active layer, the obtained semiconductor characteristics are not satisfactory. Hence, the produced film cannot be adequately used as switching devices or driver circuits of a high-definition liquid-crystal display of high image quality.

SUMMARY OF THE INVENTION

Accordingly, the present invention is intended to solve the foregoing problems.

It is an object of the present invention to provide a simple method of forming a semiconductor film of good quality only by LPCVD.

It is another object of the invention to provide a method of fabricating a good thin-film semiconductor device using such a semiconductor film.

It is a further object of the invention to provide a low-pressure CVD apparatus capable of carrying out these methods.

In one feature of the invention, a low-pressure CVD apparatus evacuates a reaction chamber at an effective pumping speed of 10 SCCM/mtorr or more.

In another feature of the invention, a hot-wall, low-pressure CVD apparatus can reduce the lowest attainable base pressure in a reaction chamber below $10^{-5}$ torr.

In a further feature of the invention, a hot-wall, low-pressure CVD apparatus makes it possible to reduce the pressure inside a reaction chamber below $10^{-5}$ torr within 10 minutes after the initiation of the operation of a vacuum-pumping machine.

In a yet other feature of the invention, a semiconductor film is deposited by the use of any of these hot-wall LPCVD apparatus.

In a still other feature of the invention, the pressure inside a reaction chamber is reduced below 2 mtorr when a semiconductor film containing silicon is deposited by LPCVD.

In an additional feature of the invention, a semiconductor film is deposited while setting the partial pressure of silane below 1 mtorr.

In a yet further feature of the invention, a thin-film semiconductor device is fabricated by using such a semiconductor film as the active layer of a transistor.

In accordance with the present invention, where a semiconductor film that can be used as the active layer of a semiconductor device is formed only by LPCVD, an LPCVD apparatus capable of reducing the lowest attainable base pressure in a reaction chamber below $10^{-5}$ torr is used. The migration length of reactant materials on the surface of the film is increased. Also, the introduction of impurities in the film is reduced. Consequently, a semiconductor film of high quality can be formed. In this way, a thin-film semiconductor device having improved characteristics can be manufactured.

In accordance with the invention, an LPCVD apparatus capable of pumping the inside of a reaction chamber below $10^{-5}$ torr within 10 minutes after the initiation of the pumping operation is used. Thus, gases escaping from the substrate, the boat jig, and the wall of the reaction chamber are sufficiently pumped out. This reduces the amount of the escaping gas molecules introduced in the film, or their hindrance to the action of the reactant materials at the surface of the film is reduced. In addition, unwanted nucleation due to the escaping gas molecules is suppressed. As a consequence of these benefits, a semiconductor film of good quality can be formed. In this manner, a thin-film semiconductor device having improved characteristics can be fabricated.

In accordance with the invention, the LPCVD apparatus with the high effective pumping speed at the reaction chamber of above 10 SCCM/mtorr enables very low pressure deposition of silicon films with the high flow rate of raw material. In this way, the amount of reactants adsorbed onto or desorbed from the growing film surface is increased. This, in turn, increases the selectivity of the raw material gas for the crystal growth versus the amorphous growth during the reaction at the film surface. Hence, with the invented LPCVD apparatus, a semiconductor film having higher quality can be deposited, or the temperature at which a polycrystalline semiconductor film is deposited can be lowered. As a result, the characteristics of a thin-film semiconductor device using such a semiconductor film are improved, or the temperature at which the thin-film semiconductor device is fabricated is lowered.

Other objects and features of the invention will appear in the course of the description thereof which follows.

DETAILED DESCRIPTION OF PREFERRED EMBODIMENTS

Example 1

Figure 1:
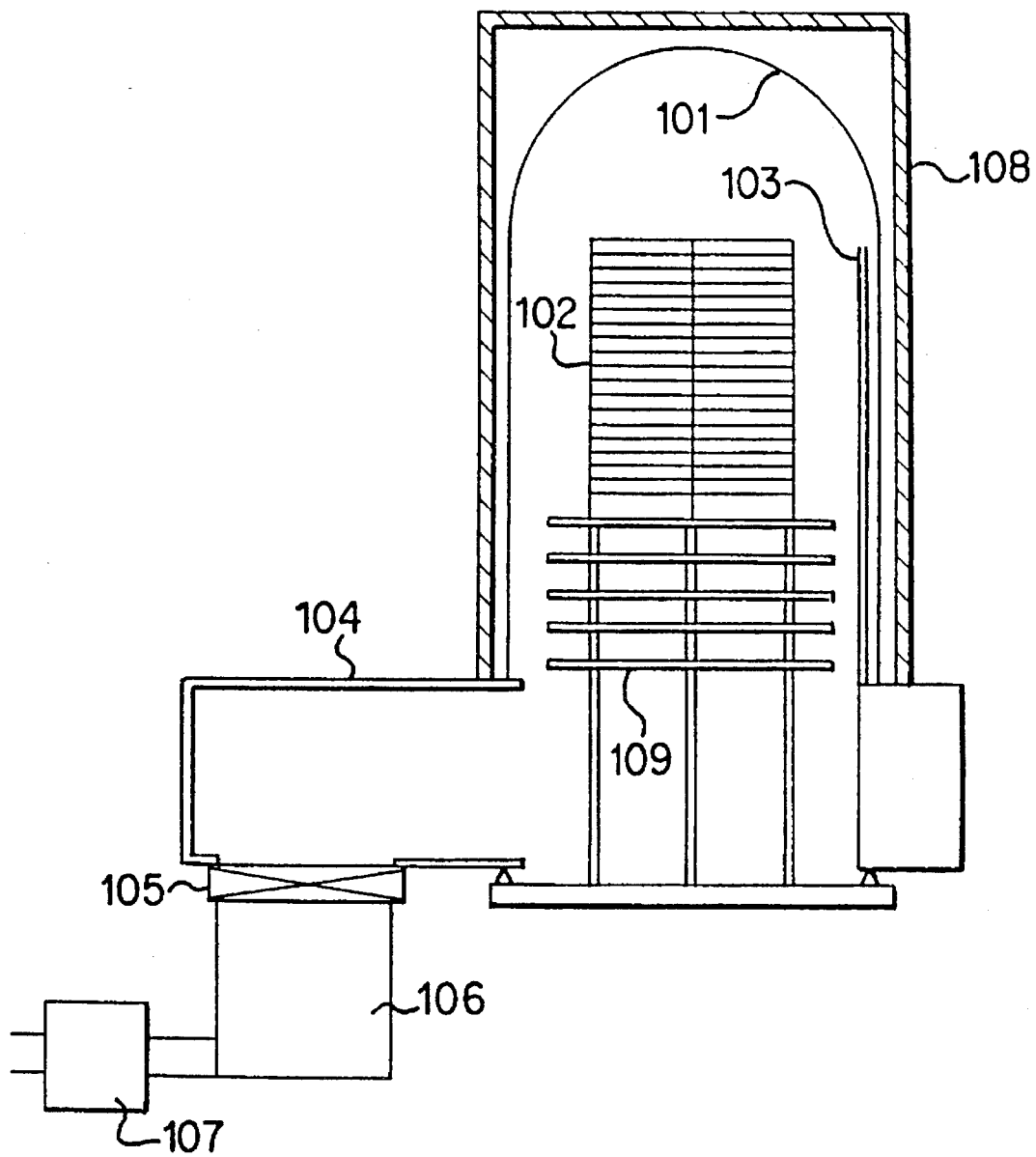
FIG. 1 is a schematic side elevation of an LPCVD apparatus according to the invention.

FIG. 1 conceptually illustrates a low-pressure chemical vapor deposition (LPCVD) apparatus according to the invention. The apparatus comprises a vertical furnace having a quartz reaction chamber 101. Glass plates or substrates 102 each 300 mm square are placed horizontally near the center of the chamber 101. The apparatus deposits semiconductor films such as silicon films by utilizing the thermal decomposition of a raw material gas such as silane ($SiH_4$), disilane ($Si_2H_6$), or germane ($GeH_4$). The reaction chamber 101 has a diameter of 600 mm and a volume of 184.5 l. In this Example 1, a vacuum-pumping machine comprises a turbomolecular pump 106 and a rotary pump 107. The vacuum-pumping machine can also be a combination of a mechanical booster pump and a dry pump. The raw material gas and a diluting gas such as helium, nitrogen, argon, or hydrogen are introduced into the reaction chamber 101 via a gas injection pipe 103, if necessary. The chamber is evacuated by the turbomolecular pump 106 via the rotary pump 107 which is connected with a manifold 104 via a gate valve and a conductance valve 105. No special partitions exists in the manifold or in the reaction furnaces. Thus they are combined into a unit. A heater 108 which is divided into three portions is mounted outside the reaction chamber 101.

A homogeneously heated zone at a desired temperature is formed around the center of the reaction chamber by separately adjusting the three portions of the heater, and has a height of about 350 mm. Temperature variations are within 0.2° C. within this heated zone when the temperature is set to 600° C. If the inserted plates or substrates are spaced 10 mm from each other, then the apparatus can process 35 plates in a single batch. In this Example 1, 17 plates are positioned within the homogeneously heated zone at intervals of 20 mm, the zone spreading over a turntable 109.

Evacuation is performed while connecting the turbomolecular pump 106 directly with the rotary pump 107. The turbomolecular pump 106 used in the present invention is of the chemically corresponding type and can operate even during deposition of a semiconductor film such as a silicon film. This turbomolecular pump pumps nitrogen at a speed of 2200 l/sec. To maximize the effective pumping speed at the entrance of the reaction chamber 101, the turbomolecular pump 106, the gate valve, and the conductance valve 105 are directly coupled to the manifold 104. As a result, when the temperature inside the furnace is 600° C., both pumps are being operated, and nitrogen is supplied from the gas injection pipe 103 at 100 SCCM, the equilibrium pressure inside the reaction chamber 101 is $1.2 \times 10^{-3}$ torr. Thus the effective pumping speed is 83.3 SCCM/mtorr. Under the same conditions, when nitrogen is supplied at 3.97 SCCM, 15.83 SCCM, 39.68 SCCM, and 300 SCCM, the equilibrium pressure inside the reaction chamber is $9.5 \times 10^{-5}$ torr, $2.5 \times 10^{-4}$ torr, $5.5 \times 10^{-4}$ torr, and $3.0 \times 10^{-3}$ torr, respectively. Their corresponding effective pumping speeds are 41.8 SCCM/mtorr, 63.3 SCCM/mtorr, 72.1 SCCM/mtorr, and 100 SCCM/mtorr.

These pressures are measured with an ionization vacuum gauge calibrated with nitrogen. When gas other than nitrogen is supplied, during reaction for example, the pressure is measured with a capacitance manometer whose value is not dependent on the gas species. The resolution of this pressure gauge is $1 \times 10^{-6}$ torr.

For the turbomolecular pump used in the present Example 1, the pumping speed Sp in the intake hole was 2200 l/sec for nitrogen when the pressure inside the intake hole was on the order of 3 mtorr. On the other hand, the effective pumping speed Se at this pressure inside the reaction chamber is 100 SCCM/mtorr=1267 l/sec as described above. The conductance Cv of the gate valve and of the conductance valve is 3150 l/sec. The total Cx of all the remaining conductances including the conductance of the manifold and the conductance between the manifold and the reaction chamber is given by $1/Se=1/Sp+1/Cv+1/Cx$, Thus, Cx=57937 l/sec. This means that since the conductance of the manifold itself and the conductance between the manifold and the reaction chamber are made sufficiently large, it is possible to make the total Cx of the remaining conductances much larger than the pumping speed Sp in the intake hole of the pump. As a result, the effective pumping speed Se in the reaction chamber can be rendered large.

Figure 9:
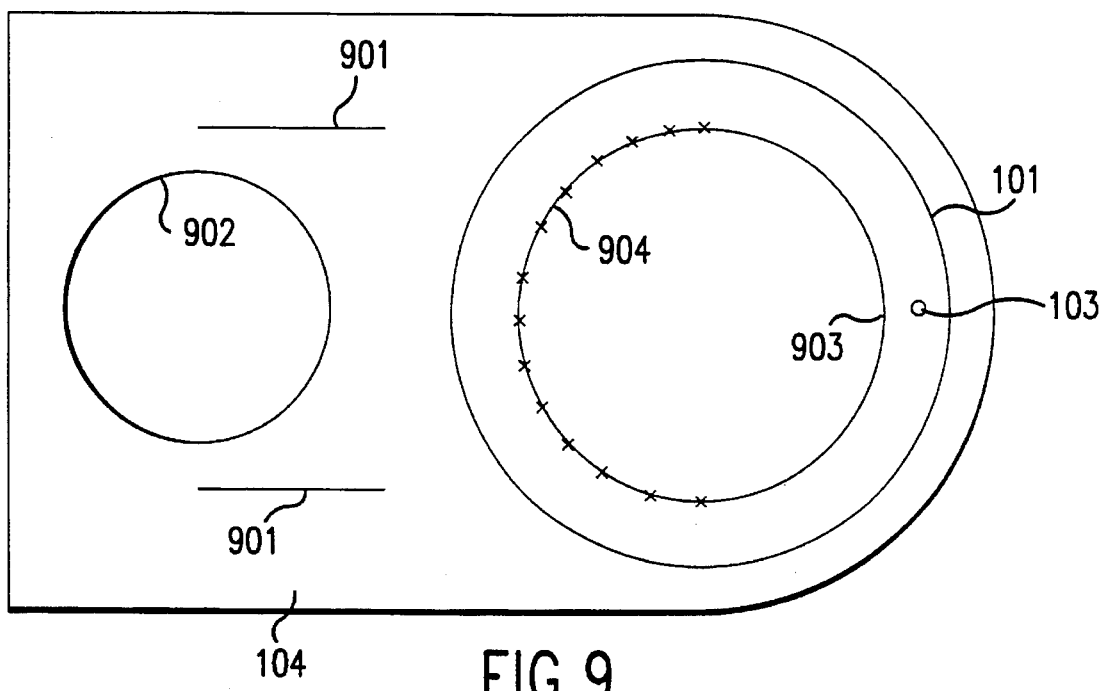
FIG. 9 is a schematic representation of the manifold of the LPCVD apparatus according to the invention shown in FIG. 1.

FIG. 9 is a conceptual plan view of the manifold of the LPCVD apparatus. The manifold is generally indicated by numeral 104. The inside of the manifold 104 is hollow. The exhaust gas from the reaction chamber passes through this broad hollow inside of the manifold 104. Reinforcing beams 901 are mounted at some locations inside the manifold. These beams 901 are sufficiently thin compared with the width 600 mm of the hollow inside of the manifold. Therefore, these beams 901 do not reduce the conductance. The thickness of the inside of the manifold is 125 mm. The cross section through which gas passes is as large as 700 cm² or more at the narrowest portion. Hence, the conductance of the inside of the manifold is made sufficiently large compared with the pumping speed Sp of the pump and the conductance Cv of the gate valve and of the conductance valve. As described previously, the turbomolecular pump is coupled to the lower portion of the manifold via the gate valve and the conductance valve. The diameter of the intake hole 902 of this vacuum-pumping machine is 260 mm and, therefore, its cross-sectional area is 531 cm². The lower surface and the upper surface of the manifold are provided with holes 903 to permit insertion of glass plates or substrates into the reaction chamber. In the present LPCVD apparatus, glass plates 300 mm square can be placed horizontally inside the reaction chamber. Thus the diameter of the holes 903 is 460 mm. Preferably the holes 903 are located as close as possible to the intake hole 902 of the vacuum-pumping machine, as long as the strength of the manifold permits. As shown in FIG. 1, the reaction chamber 101 is mounted over the manifold. The gas injection pipe 103 stands upright on the manifold 104 on the opposite side of the center of the plate insertion hole from the intake hole of the vacuum-pumping machine on the line connecting the center of the intake hole 902 and the center of the insertion hole 903. Therefore, the gas inside the reaction chamber flows downwardly and from right to left as viewed in FIG. 9. Since the gas injection pipe and the intake hole of the manifold are arranged symmetrically, the occurrence of turbulent flow is reduced to a minimum. Consequently, a semiconductor film with uniform quality can be deposited uniformly. Intake of gas into the manifold from the reaction chamber is done via the gas intake portion 904 of the manifold. The intake portion 904 is formed in the side surface facing the plate insertion port of the manifold, as shown in FIG. 1. Of the side surface facing the plate insertion port of the manifold, the whole semicircular portion on the side of the vacuum-pumping machine is opened, thus forming the intake portion 904. Because the radius of the plate insertion port is 230 mm and the thickness of the manifold is 125 mm, the area of the opening in the intake portion 904 of the manifold is as large as 903 cm². It substantially follows that the manifold is integral with the reaction chamber. For this reason, the conductance between the manifold and the reaction chamber is much larger than the pumping speed of the pump. The opening formed in the whole side surface of the manifold located on the side of the reaction chamber makes it meaningless to distinguish between the reaction chamber and the manifold. Their differences lie in only temperature and material. They cannot be discriminated from each other in terms of gas flow. In this way, the cross-sectional area of the narrowest portion of the manifold is larger than the cross-sectional area of the gas intake portion of the vacuum-pumping machine. Furthermore, the effective pumping speed in the reaction chamber can be rendered large as described above, because the manifold intake portion is made as large as possible.

The turbomolecular pump 106 reaches a constant rotary condition in about 10 minutes after the initiation of the operation. During this period, if the gate valve and the conductance valve 105 are opened fully, the base pressure inside the reaction chamber is $1.0 \times 10^{-6}$ torr while the reaction chamber is kept at 600° C. After a lapse of 10 minutes since the turbomolecular pump has reached the constant rotary condition, the back pressure inside the reaction chamber is $4.0 \times 10^{-7}$ to $9.0 \times 10^{-7}$ torr at 600° C. When the gate valve is closed, the pressure inside the reaction chamber is retained on the order of 1 torr, and the turbomolecular pump is operating in a steady state, if the gate valve is opened, the back pressure inside the reaction chamber is again $4.0 \times 10^{-7}$ to $9.0 \times 10^{-7}$ torr at 600° C. after a lapse of 10 minutes since the gate valve has been opened. This can be accomplished for the following reason. The turbomolecular pump is directly coupled to the manifold to increase the conductance to a maximum. Thus, the effective pumping speed in the reaction chamber is made very large, i.e., above 40 SCCM/mtorr. Hence, a high vacuum of $10^{-7}$ torr is attained only after a lapse of 10 minutes since the turbomolecular pump has reached the steady condition or the gate valve has been opened.

Seventeen Glass plates each 235 mm square were inserted into this LPCVD apparatus and heated in a vacuum to a temperature between 500° C. and 600° C. which corresponds to the deposition temperature. The leakage rate of desorbing gases was about $2 \times 10^{-5}$ to $7 \times 10^{-5}$ torr/min. Consequently, the increase in the pressure caused by gaseous impurities such as desorbing gases during the period of 10 minutes in a vacuum was about $2 \times 10^{-4}$ to $7 \times 10^{-4}$ torr.

The novel LPCVD apparatus is capable of lowering the degree of vacuum of 1 torr below $1 \times 10^{-6}$ torr within 10 minutes while the vacuum-pumping machine such as a turbomolecular pump is operating steadily as described above. Therefore, the novel LPCVD apparatus can sufficiently evacuate unwanted gases inevitably escaping from the glass plates and from the boat jig. These desorbing gases contain water ($H_2O$) and oxygen ($O_2$), which impede growth of good silicon films. More specifically, when a semiconductor film such as a silicon film is deposited, gaseous impurities produced from the glass plates and from the boat jig can nucleate for the deposited film at the initial stage of the deposition. Therefore, if the escaping gases are not sufficiently evacuated, a large amount of gaseous impurities is adsorbed on the surfaces of the glass plates, creating numerous nuclei. This decreases the diameters of the particles forming the deposited semiconductor film, thus leading to a deterioration in the characteristics of the semiconductor film. Where an amorphous semiconductor film is deposited and subsequently crystallized by thermal treatment or laser irradiation, the presence of a large amount of nuclei originating from desorbing gases decreases the average particle diameter after the crystal growth. This again deteriorates the semiconductor characteristics. Furthermore, these desorbing gaseous impurities suppress the migration of the raw material gas at the grown surface during deposition. As a result, the ability of the raw material gas such as silane, disilane, germane, phosphine ($PH_3$), or diborane ($B_2H_6$) to find the most stable position for crystal energy drops. In consequence, the formed semiconductor film contains many grain boundaries or amorphous components. This causes the quality of the semiconductor film to be poor. If the desorbing gaseous impurities enter the growing semiconductor film, then the characteristics of the semiconductor will be deteriorated further.

It can be seen from the foregoing that the use of an LPCVD apparatus which evacuates gaseous impurities inevitably desorbing from glass plates and so on at a sufficiently high rate is appropriate to deposit a semiconductor film of good quality. Generally, outgassing in a vacuum produces a pressure increase of about $10^{-4}$ torr in 10 minutes. An LPCVD apparatus equipped with a vacuum-pumping system having an evacuation capability larger than this outgassing rate, i.e., one which is capable of lowering a vacuum of about 1 torr below $10^{-5}$ torr in 10 minutes, can pump desorbing gaseous impurities out of the reaction chamber at a sufficiently high rate. The result is that a semiconductor film of good quality can be formed. Also, this vacuum-pumping system can be fabricated easily by eliminating unwanted pipe between the vacuum-pumping system and the reaction chamber and mounting the vacuum-pumping machine almost directly in the reaction chamber via requisite valves such as the gate valve and the conductance valve.

FIGS. 2, (a)–(e), are cross-sectional views of a thin-film semiconductor device forming an MISFET. In this Example 1, the thin-film semiconductor device is of the non-self-aligned staggered structure. The present invention can also be applied to a thin-film semiconductor device of the inverse staggered structure or to a self-aligned thin-film semiconductor film.

In the present Example 1, each square substrate 201 consists of quartz glass with a length of 235 mm. No limitations are imposed on the type or size of each substrate as long as it withstands the semiconductor film deposition temperature. Also, in this example, the semiconductor film is a film of intrinsic silicon. The semiconductor film can also be a silicon film containing impurities such as donors or acceptors (e.g., phosphorus or boron) or germanium, an intrinsic germanium film, or a germanium film containing donors or acceptors.

First, a film 202 of silicon dioxide ($SiO_2$) defining an underlying layer-protecting film was formed on the substrate 201 by atmospheric pressure CVD (APCVD) or by sputtering. Then, a silicon film containing dopants becoming donors or acceptors was deposited by LPCVD and patterned into source and drain regions 203 (FIG. 2(a)). In the present Example 1, phosphorus was selected as a dopant. Phosphine ($PH_3$) and $SiH_4$ were mixed, and a silicon film containing the dopant was deposited as a 1500 Å-thick-film at 600° C. by LPCVD.

Figure 2A:
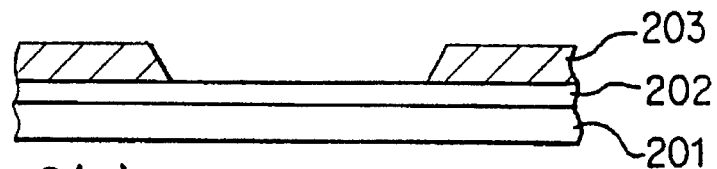
FIGS. 2, (a)–(e), are cross-sectional views of a thin-film semiconductor device according to the invention, for illustrating steps successively performed to fabricate the device.
Figure 2B:
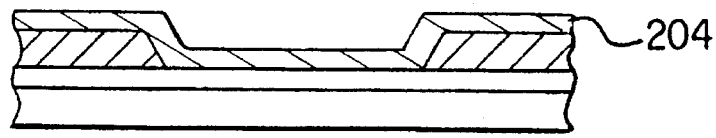
Figure 2C:
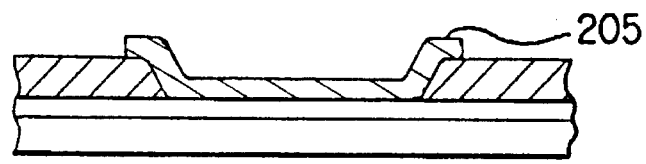
Figure 2D:
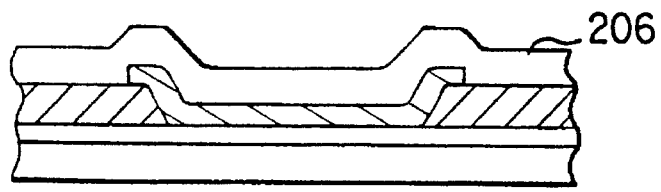
Figure 2E:
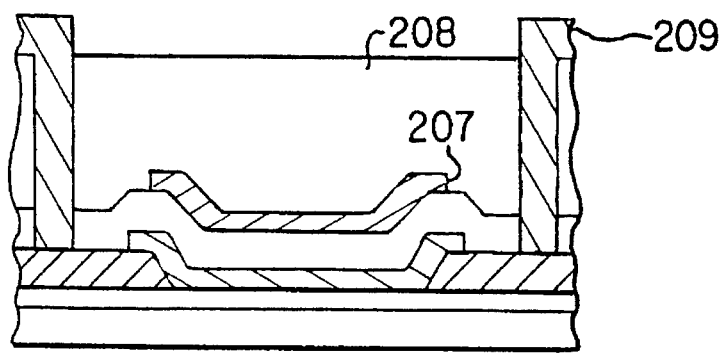

Subsequently, a channel portion silicon film 204 defining the active layer of a transistor was deposited by the LPCVD apparatus already described in connection with FIG. 1 (FIG. 2(b)). In the present Example 1, $SiH_4$ was employed as a raw material gas. Diluting gas was not used at all. The silicon film 204 was deposited at 600° C. The substrate was inserted into the reaction chamber 101 in such a way that the front side of the substrate faced downward, while the chamber 101 was maintained at 400° C. At this time, pure nitrogen flowed out of the gas injection pipe 103 at 30 SLM (Standard Liters per Minute) to minimize the flow of air into the reaction chamber when the substrate was inserted.

After the insertion of the substrate, the operation of the turbomolecular pump was started. After the pump reached a steady condition, a leakage inspection was performed for 2 minutes. At this time, the leakage rate of desorbing gases was $4.3 \times 10^{-5}$ torr/min. Thereafter, temperature was elevated from an insertion temperature of 400° C. to a deposition temperature of 600° C. in one hour. No gas was admitted into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was $6.8 \times 10^{-7}$ torr. During the remaining 50 minutes, nitrogen gas having a purity exceeding 99.9999% was kept supplied at 300 SCCM. At this time, the equilibrium pressure inside the reaction chamber was $3.0 \times 10^{-3}$ torr. After reaching the deposition temperature, $SiH_4$ was supplied as a raw material gas at 250 SCCM, and a silicon film was deposited for 6 minutes 51 second. During this operation, the conductance valve was controlled to maintain the pressure inside the reaction chamber at 28.5 mtorr. During the reaction, the pressure was measured with a capacitance manometer whose value is not dependent on the gas species. The thickness of the resulting silicon film was 294 Å. The silicon film was patterned to form a channel portion silicon film 205 becoming the active layer of the transistor (FIG. 2(c)).

Then, a gate-insulating film 206 was formed by electron cyclotron resonance plasma-enhanced chemical vapor deposition (ECR PECVD) or by APCVD. In the present Example 1, the gate-insulating film was made of $SiO_2$, which in particular, was deposited as a 1500 Å-thick-film by ECR PECVD (FIG. 2(d)). Subsequently, a thin film defining a gate electrode 207 was formed by sputtering, CVD, or other method. In this Example 1, the gate electrode was made of chromium (Cr). Chromium was sputter-deposited as a 1500 Å-thick-film. After the thin film defining the gate electrode was deposited, the film was patterned. Then, an interlayer insulating film 208 having a thickness of 5000 Å was deposited. Contact holes were formed. Source and drain interconnection electrodes 209 were formed by sputtering, thus completing a thin-film semiconductor device (FIG. 2(e)).

Figure 3:
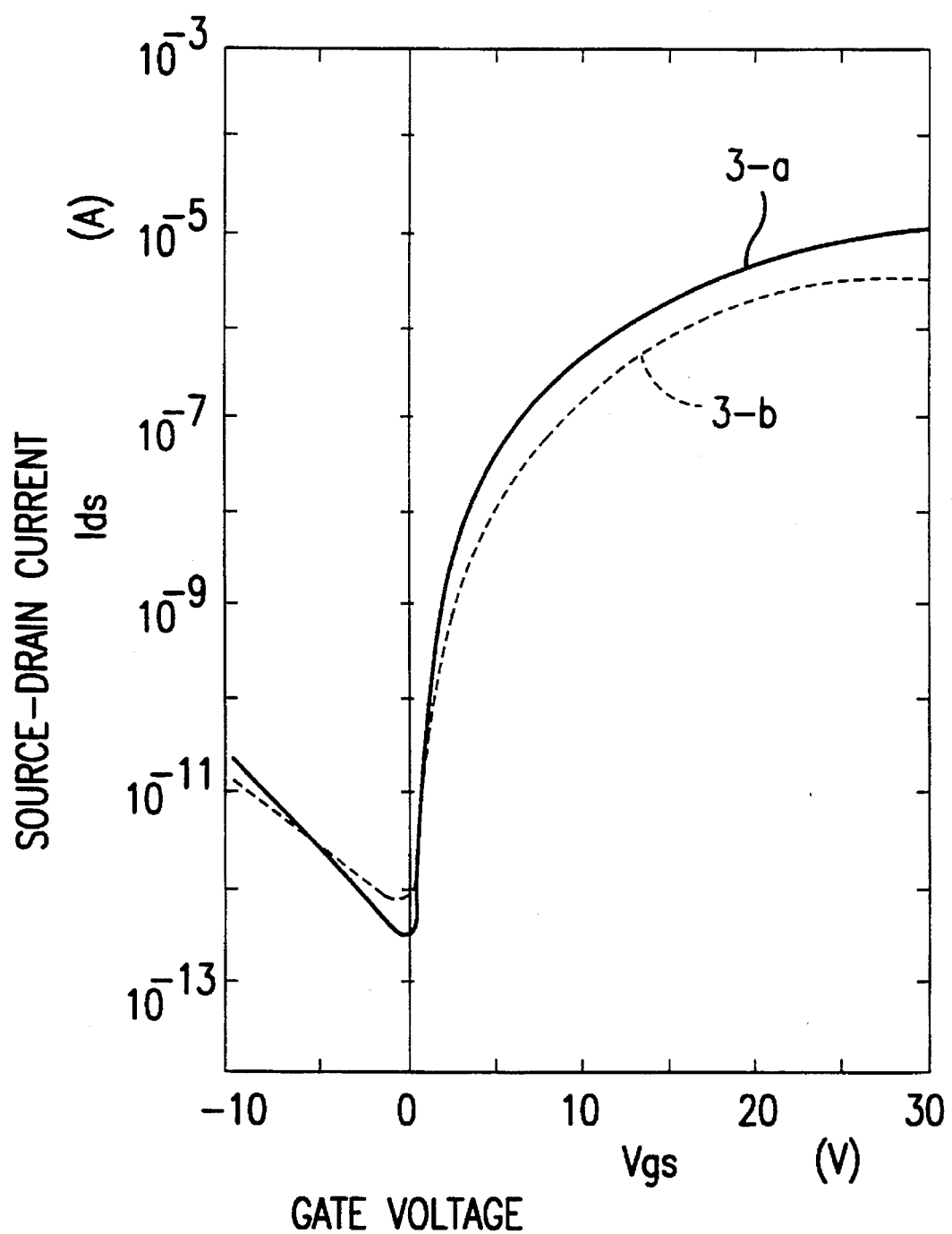
FIGS. 3–6 are graphs illustrating the advantages of thin-film semiconductor devices according to the invention.

Curve 3-a of FIG. 3 shows the Ids (source-drain current) –Vgs (gate voltage) characteristics of the transistor of a thin-film semiconductor device manufactured on a trial basis in this way. The source-drain current Ids was measured at Vds=4 V at 25° C. The length L of the transistor channel portion was 10 μm, and the width W was 10 μm. The transistor on-current, which is defined as Ids when the transistor is in the on-state of Vds=4 V and Vgs=10 V was measured to be $3.34 \times 10^{-7}$ A. The transistor off-current, which is the Ids at the off-state of the transistor of Vgs=0 V, was $2.24 \times 10^{-13}$ A. As a result, a good thin-film semiconductor device was derived whose source-drain current Ids varies by more than six orders of magnitude with 10 V modulation of the gate voltage. The effective electron mobility found from the saturation current region of this thin-film semiconductor device was 6.1 $cm^2$/V.sec.

A thin-film semiconductor device was fabricated similarly to the above-described novel method except that a silicon film for forming an active layer defining a channel portion was deposited by the prior art LPCVD. For comparison, curve 3-b of FIG. 3 shows the Ids-Vgs characteristics of this device.

Figure 7:
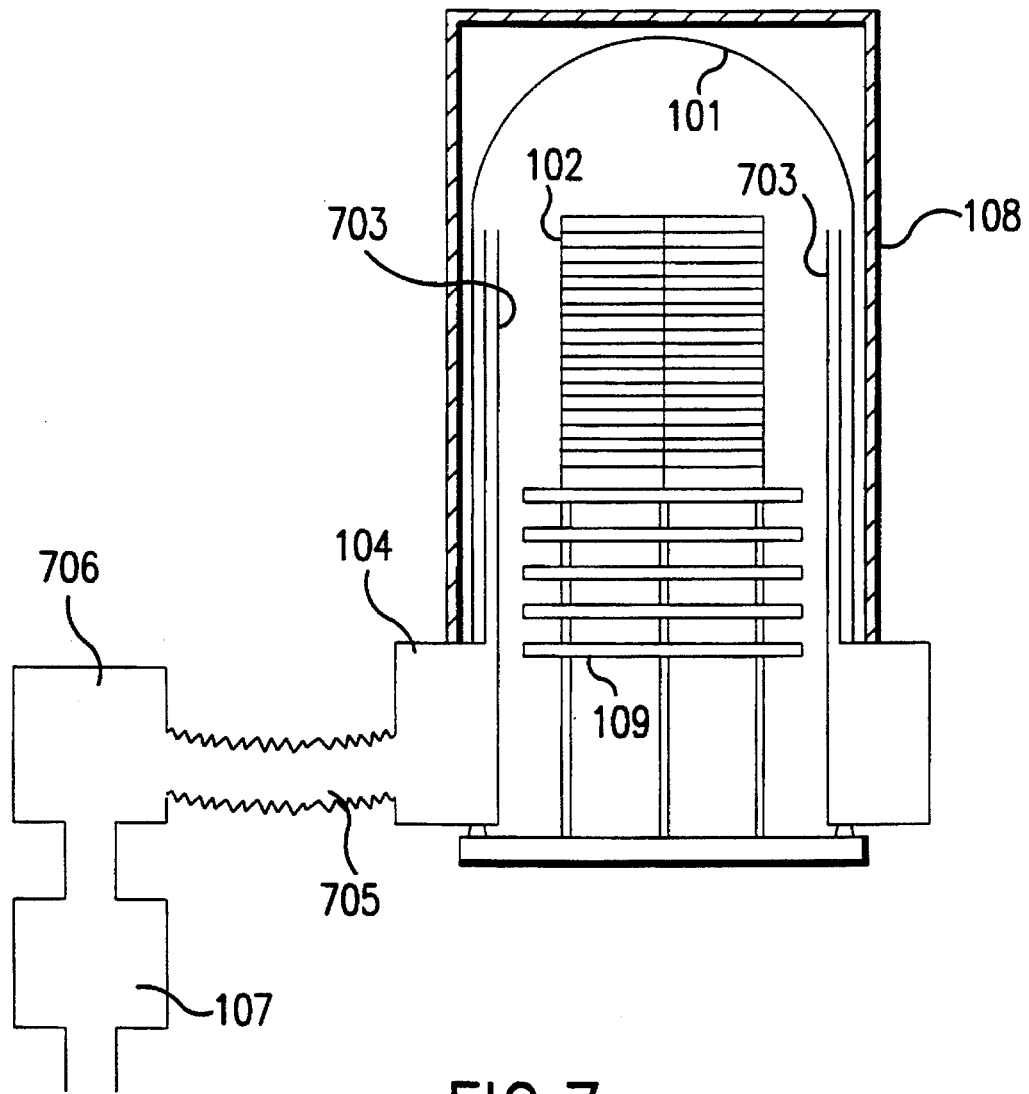
FIG. 7 is a schematic side elevation of a conventional LPCVD apparatus.
Figure 8A:
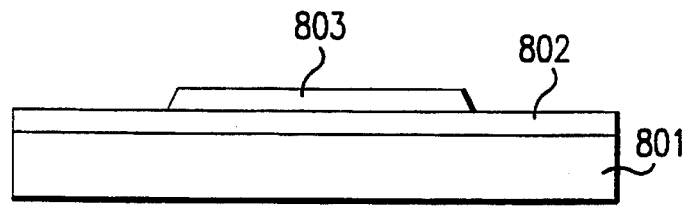
FIGS. 8, (a)–(d), are cross-sectional views of another thin-film semiconductor device according to the invention, for illustrating steps successively performed to fabricate the device.
Figure 8B:
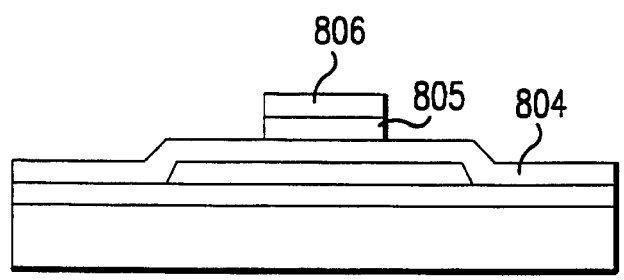
Figure 8C:
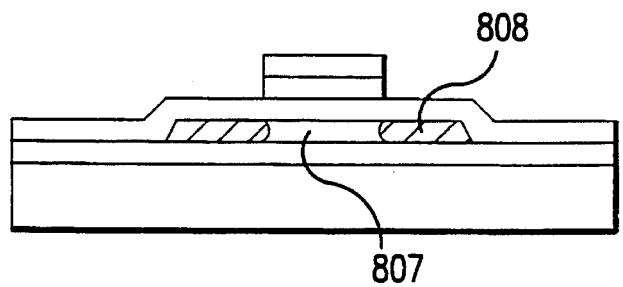
Figure 8D:
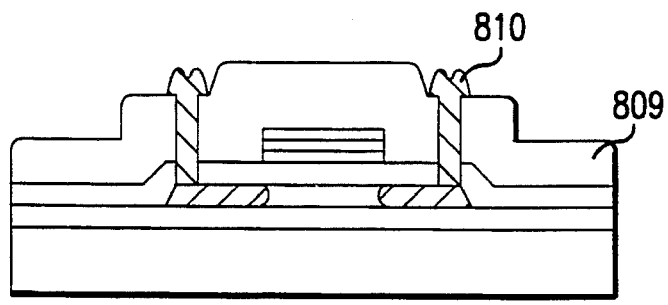
Figure 10:
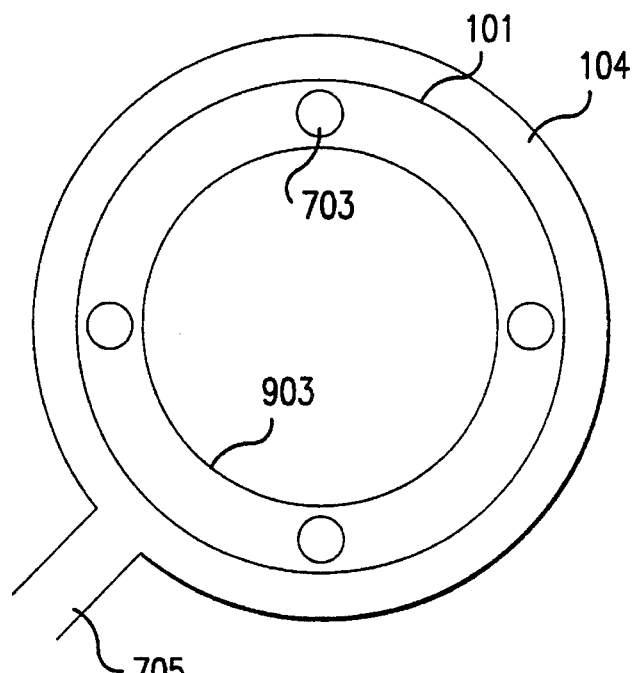
FIG. 10 is a schematic representation of the manifold of a conventional LPCVD apparatus.

As shown in FIG. 7, the conventional LPCVD apparatus is similar to the novel LPCVD apparatus shown in FIG. 1 in size of the reaction chamber, shape of glass plates, type of glass plates, number of glass plates, position of insertion, and heating system but differs greatly in evacuating system. More specifically, the conventional LPCVD apparatus evacuates gas by means of the rotary pump 107 and the mechanical booster pump 706. Gas pumped out of the reaction chamber 101 is forced through the exhaust pipes 703 standing upright from the manifold 104. An exhaust pipe 705 extends from the manifold to the vacuum-evacuating machine to expel the gas from the manifold. FIG. 10 is a conceptual representation of the manifold of the conventional LPCVD apparatus, as taken in a vertical direction. The conventional manifold is shaped like a doughnut and has an outside diameter of 600 mm, a width of 70 mm, a thickness of 125 mm, and a cross-sectional area of about 87.5 $cm^2$. The conductance is very small The exhaust pipes 703 which are four in number stand between the manifold and the reaction chamber. Each pipe 703 is cylindrical and has a diameter of 40 mm and a length of 685 mm. The conductance of the exhaust pipes is 11.64 l/sec and so the conductance between the manifold and the reaction chamber is on the order of 47 l/sec. When helium was supplied at 74 SCCM under the condition that the temperature inside the reaction chamber was 600° C., the effective pumping speed was such that the equilibrium pressure inside the reaction chamber was 25.2 mtorr. The lowest attainable base pressure in the reaction chamber was $10^{-4}$ torr.

With this conventional LPCVD apparatus, a silicon film defining the active layer channel formation region was deposited for 8 minutes 30 second under the conditions: the deposition temperature was 600° C., the flow rate of $SiH_4$ was 70 SCCM, and the pressure inside the reaction furnace was 28.4 mtorr. The thickness of the deposited silicon film was 299 Å. The ON current of the thin-film semiconductor device fabricated by the prior art techniques in this way was $1.1 \times 10^{-7}$ A, and the OFF current was $8.76 \times 10^{-13}$ A. The effective electron mobility found from the saturation current region was 2.48 $cm^2$/V.sec.

Comparison of these results reveals that the present invention is for superior to the prior art techniques. In particular, in accordance with the present invention, the electron mobility is at least twice as large as the electron mobility obtained by the prior art techniques. The ON current is at least three times as large as the OFF current derived by the prior art techniques. Furthermore, the OFF current is reduced below one third. In this way, the transistor characteristics are improved greatly. In addition, the deposition rate obtained by the novel method is 42.9 Å/min. which is higher than the deposition rate of 35.2 Å/min. derived by the prior art techniques at the same temperature and at the same pressure. Hence, the novel method shortens the manufacturing time and improves the throughput. Moreover, the invention realizes an LPCVD apparatus having high evacuation capability in a high vacuum, which would have been impossible to accomplish with the normal hot-wall type, by making use of the aforementioned special vacuum-pumping system. Consequently, a multiplicity of glass plates or substrates can be processed in one batch. At the same time, excellent uniformity is secured. In practice, in the present Example 1, 17 square glass plates with the length of 235 mm were processed simultaneously. In each glass plate, the film thickness variations are within 1% over the whole surface except for portions located within 1 cm from the four corners of the plate. Each glass substrate 235 mm square has an area of 552.25 $cm^2$. The region excluding the four corner portions has an area of 549.11 $cm^2$. The film thickness variations within this region are less than 2 Å. Also, the film thickness variations among the 17 glass plates excluding the lowermost one are very small, the lowermost one being thinner by about 30 Å. Of these 17 glass plates, the thinnest film is 289 Å, while the thickest film is 298 Å. In this way, a large number of semiconductor films of high quality can be processed simultaneously and quite uniformly by the novel LPCVD apparatus having high evacuation capability in a high vacuum.

It is generally known that temperature and pressure are important factors in depositing a silicon film forming the channel of a silicon thin-film semiconductor device. It has been considered that if the temperature and pressure are the same, silicon films of the same quality will be deposited and thin-film semiconductor devices having the same transistor characteristics will be fabricated. The present invention improves the pumping system to shorten the deposition time if the temperature and pressure remain the same. This results in an improvement in the throughput. By depositing semiconductor films of improved quality, the transistor characteristics can be improved greatly.

Example 2

FIGS. 2, (a)–(e), are cross-sectional views of a thin-film semiconductor device forming an MISFET according to the invention, for illustrating steps successively performed to fabricate the device. In this Example 2, the thin-film semiconductor device is of the non-self-aligned staggered type, The present invention is also applicable to a thin-film semiconductor device of the reverse staggered structure and also to a thin-film semiconductor device Of the self-aligned type.

In the present Example 2, each square substrate 201 consists of quartz glass with a length of 235 mm. No limitations are imposed on the type or size or each substrate as long as it withstands the semiconductor film deposition temperature Also in this Example 2, the semiconductor film is made of silicon. In the same way as in Example 1, the semiconductor film can also contain germanium (Ge), silicon germanium ($Si_xGe_{1-x}$, where $0<x<1$), and donors or acceptors.

First, a film 202 of silicon dioxide ($SiO_2$) defining an underlying layer-protecting film was formed on the substrate 201 by atmospheric pressure CVD (APCVD) or sputtering. Then, a silicon film containing dopants defining donors or acceptors was deposited by LPCVD and patterned into source and drain regions 203 (FIG. 2(a)). In the present Example 2, phosphorus was selected as a dopant. Phosphine ($PH_3$) and $SiH_4$ were mixed, and a silicon film containing the dopant was deposited as a 1500 Å-thick-film at 600° C. by LPCVD.

Subsequently, a silicon film 204 which forms a channel portion and acting as the active layer of a transistor was deposited by the LPCVD apparatus already described in detail in Example 1 in connection with FIG. 1 (FIG. 2(b)). In the present Example 2, $SiH_4$ was employed as a raw material gas. Diluting gas was not used at all. The silicon film 204 was deposited at 600° C. The substrate was inserted into the reaction chamber 101 in such a way that the front side of the substrate faced downward, while the chamber 101 was maintained at 400° C. At this time, pure nitrogen flowed out of the gas injection pipe 103 at 30 SLM to minimize the flow of air into the reaction chamber when the substrate was inserted.

After the insertion of the substrate, the operation of the turbomolecular pump was started. After the pump reached a steady condition, a leakage inspection was performed for 2 minutes. At this time, the leakage rate of desorbing gases was $4.0\times10^{-5}$ torr/min. Thereafter, the temperature was elevated from an insertion temperature of 400° C. to a deposition temperature of 600° C. in one hour. No gas was admitted into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was $6.5\times10^{-7}$ torr. During the remaining 50 minutes, nitrogen gas having a purity exceeding 99.9999% was kept supplied at 300 SCCM. At this time, the equilibrium pressure inside the reaction chamber was $3.0\times10^{-3}$ torr. After reaching the deposition temperature, $SiH_4$ was supplied as a raw material gas at 250 SCCM, and a silicon film was deposited for 12 minutes 46 second. During this operation, the conductance valve was kept fully open. The pressure inside the reaction furnace was measured with a capacitance manometer whose value is not dependent on the gas species. After introducing raw material gas $SiH_4$ into the reaction chamber, the equilibrium pressure inside the reaction chamber was 2.55 mtorr for 3 minutes 16 second. This measured pressure is equal to the value obtained when $SiH_4$ was supplied at 250 SCCM and the temperature inside the reaction chamber was 25° C. Under these conditions, the relation of the thickness T (Å) of the deposited film to the deposition time t (in minutes) is given by $$T(Å)=-87.9(Å)+30.4(Å/min.)\times t(min.)$$

Therefore, we estimate that the raw material gas was not thermally decomposed for about 3 minutes after introducing the raw material gas into the reaction chamber. Then, the pressure inside the reaction chamber gradually increased and reached 2.94 mtorr when 11 minutes 16 second passed after the introduction of the raw material gas. This value of pressure was maintained until the deposition ended, i.e., after a lapse of 12 minutes 46 second after the introduction of the raw material gas. The increase in the pressure inside the reaction chamber was attributed to an increase in the amount of produced hydrogen, which was, in turn, caused by a variation in the reaction coefficient of the raw material silane. Taking account of this pressure variation, the reaction coefficient of the raw material silane immediately prior to the end of the decomposition is estimated at 16.7%. We estimate from this that the partial pressure of the silane was 2.10 mtorr.

In the present Example 2, 17 square substrates with a length of 235 mm were inserted into the reaction chamber. The resulting total internal area of the reaction chamber is 44040 $cm^2$. When it is assumed that the deposition rate is uniform over the whole interior of the reaction chamber, then from the deposition rate and the total internal area of the reaction chamber the reaction coefficient of the raw material silane and the partial pressure of the silane will be estimated at 10.0% and 2.52 mtorr, respectively. The thickness of the obtained silicon film was 301 Å. This silicon film 205 was patterned to form a channel portion defining the active layer of a transistor (FIG. 2(c)).

Then, a gate-insulating film 206 was formed by ECR PECVD, APCVD, or other method. In the present Example 2, the gate-insulating film was formed by depositing $SiO_2$ to a thickness of 1500 Å by ECR PECVD (FIG. 2(d)). Subsequently, a thin film defining a gate electrode 207 was deposited by sputtering or CVD. For this purpose, chromium (Cr) was deposited to a thickness of 1500 Å by sputtering. Thereafter, the thin film was patterned, and then an interlayer insulating film 208 having a thickness of 5000 Å was deposited. Then, contact holes were formed. Source and drain interconnection electrodes 209 were formed by sputtering. Thus, a thin-film semiconductor film was completed (FIG. 2(e)).

Figure 4:
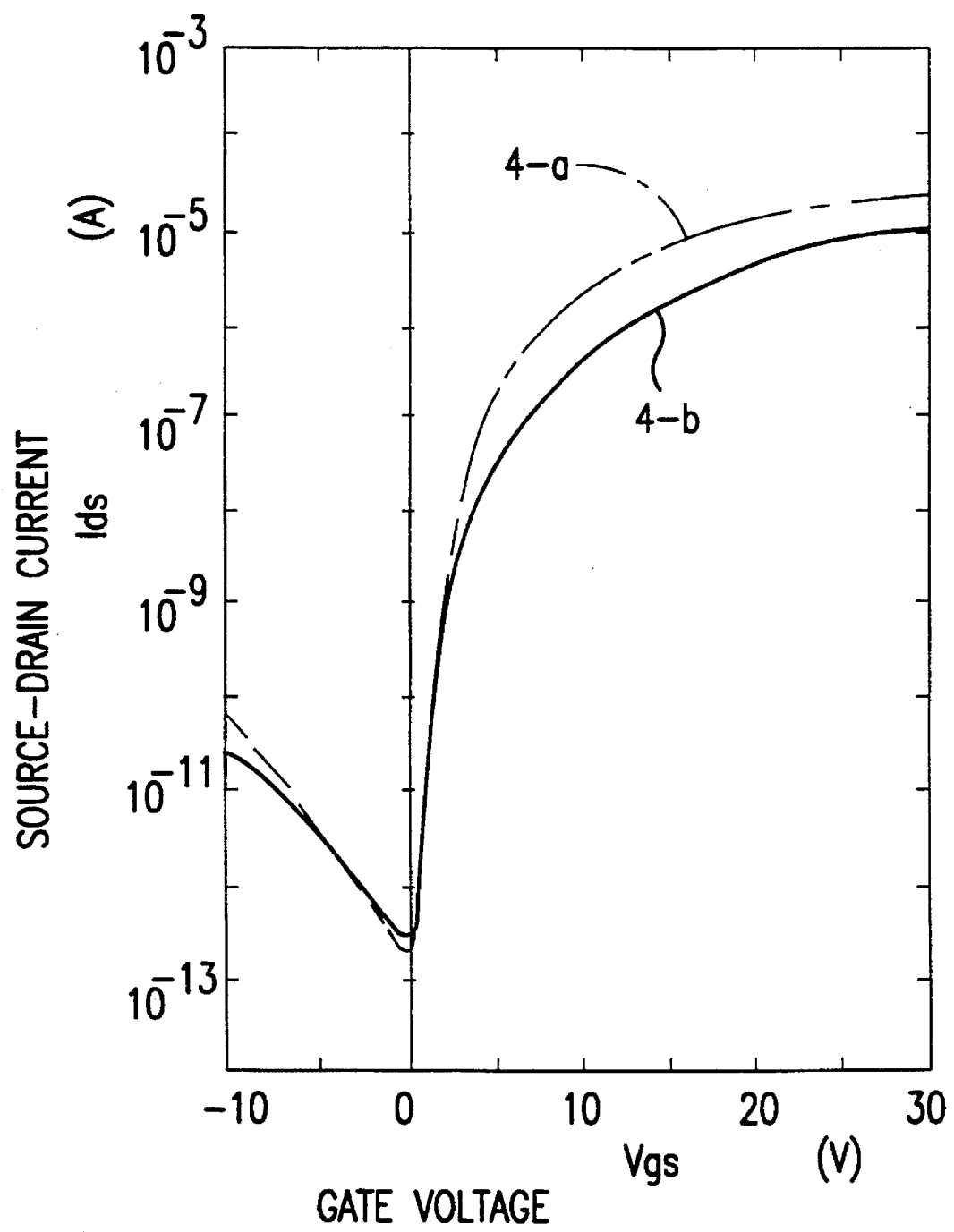

Curve 4-a of FIG. 4 shows the Ids (source-drain current)-Vgs (gate voltage) characteristics of the transistor of a thin-film semiconductor device manufactured on a trial basis in this way. The source-drain current Ids was measured by Vds=4 V at 25° C. The length L of the transistor channel portion was 10 μm, and the width W was 10 μm. When the transistor was in the on-state under the conditions Vds=4 V and Vgs=10 V, the ON current was $$I_{ON}=(2.40+0.08, -0.07)\times10^{-6} A$$

with a confidence coefficient of 95%. When the transistor was in an off-state under the condition Vgs=0 V, the OFF current was $$I_{OFF}=(1.82+0.64, -0.47)\times10^{-13} A$$

Thus, the source-drain current Ids of the thin-film semiconductor device varied by more than seven orders of magnitude with a modulation of 10 V of the gate voltage. This is a satisfactory property. The effective electron mobility found from the saturation current region of this thin-film semiconductor device was 10.84±0.29 cm$^2$/V.sec. In this manner, a good thin-film semiconductor film was obtained.

For comparison, a thin-film semiconductor film was fabricated similarly to the above-described thin-film semiconductor device except that the conductance valve was closed fully to deposit a silicon film forming the active layer channel at a reduced effective pumping speed in the reaction chamber. Curve 4-b of FIG. 4 shows the Ids-Vgs characteristics of this device. When the conductance valve was closed fully, and when nitrogen was supplied into the reaction chamber at 100 SCCM, 200 SCCM, and 300 SCCM, the equilibrium pressure inside the reaction chamber was 1.2×10$^{-2}$ torr, 2.6×10$^{-2}$ torr, and 4.0×10$^{-2}$ torr, respectively, at a furnace inside temperature of 600° C. The corresponding effective pumping speeds were 8.33 SCCM/mtorr, 7.69 SCCM/mtorr, and 7.50 SCCM/mtorr. These effective pumping speeds are about twice as large as the effective pumping speed of the conventional LPCVD apparatus and are not typical of the prior art techniques. However, the above-described thin-film semiconductor device was fabricated as an example having a small effective pumping speed under similar manufacturing conditions except for that condition to make comparisons.

In this way, a channel portion silicon film defining the active layer of a transistor was deposited, using the novel LPCVD apparatus while closing the conductance valve fully. In this comparative example, SiH$_4$ was used as the raw material gas. No diluting gas was employed. A silicon film 204 was deposited at a temperature of 600° C. The substrate was inserted into the reaction chamber 101 which was kept at 400° C. such that the front side of the substrate faced downward. At this time, pure nitrogen gas flowed out of the gas injection pipe 103 at 30 SLM to minimize flow of air into the reaction chamber when the substrate was inserted. After the pump has reached a steady condition, a leakage inspection was performed for 2 minutes. At this time, the leakage rate of desorbing gases was 4.3×10$^{-5}$ torr/min. Thereafter, the temperature was elevated from an insertion temperature of 400° C. to a deposition temperature of 600° C. in one hour. No gas was admitted into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was 6.8×10$^{-7}$ torr. During the remaining 50 minutes, nitrogen gas having a purity exceeding 99.9999% was kept supplied at 300 SCCM. At this time, the equilibrium pressure inside the reaction chamber was 3.0×10$^{-3}$ torr. After reaching the deposition temperature, SiH$_4$ was supplied as a raw material gas at 250 SCCM, and a silicon film was deposited for 6 minutes 51 second. During this operation, the conductance valve was kept fully closed. The pressure inside the reaction furnace was 28.5 mtorr. The pressure inside the reaction furnace was measured with a capacitance manometer whose value is not dependent on the gas species. The thickness of the silicon film obtained in this manner was 294 Å. A thin-film semiconductor film was fabricated on a trial basis similarly to Example 2 of the invention except for this.

The ON current of this comparative example of thin-film semiconductor device fabricated in this way was $$I_{ON}=(3.34+0.11, -0.12)\times10^{-7}A$$

The OFF current was $$I_{OFF}=(2.24+0.79, -0.58)\times10^{-13}A$$

The effective electron mobility found from the saturation current region of this thin-film semiconductor device was 6.12±0.29 cm$^2$/V.sec. As can be seen from this comparative example, the present invention increased the ON current by a factor of more than 7 compared with the prior art technique and suppressed the OFF current. As a result, the ratio of the OFF current to the ON current was more than 10 times as large as the ratio conventionally obtained. In the present invention, the channel portion silicon film was formed by the LPCVD apparatus having an effective pumping speed exceeding 10 SCCM/mtorr.

It is generally known that temperature and pressure are important factors in depositing a silicon film which will be the channel layer of a silicon thin-film semiconductor device. Since the conventional LPCVD apparatus has a slow pumping speed, the deposition rate becomes as low as about 8 Å/min. and the obtained film has poor semiconductive properties when the deposition temperature is set to be 600° C. and the partial pressure of silane is less than 3 mtorr, for example. On the other hand, in accordance with the present invention, the deposition rate is increased by increasing the effective pumping speed. Hence, the deposition time is shortened. Furthermore, the transistor characteristics can be improved greatly by low-pressure deposition.

Example 3

FIGS. 2, (a)–(e), are cross-sectional views of a thin-film semiconductor device forming an MISFET, for illustrating steps successively performed to fabricate the device. In this Example 3, the thin-film semiconductor device is of the non-self-aligned staggered structure. The present invention is also applicable to a thin-film semiconductor device of the reverse staggered structure and also to a thin-film semiconductor device of the self-aligned type.

In this Example 3, the glass plate or substrate 201 consists of a square quartz glass with a length of 235 mm. No limitations are imposed on the type or size of each substrate as long as it withstands the semiconductor film deposition temperature. In this Example 3, the semiconductor film is made of an intrinsic silicon film. The semiconductor film can also be a silicon film containing donors or acceptors or made of Si$_x$Ge$_{1-x}$ (0<x< 1) containing germanium. Also, the semiconductor film can consist of SiGe$_x$.

First, a film 202 of silicon dioxide (SiO$_2$) defining an underlying layer-protecting film was formed on the substrate 201 by atmospheric pressure CVD (APCVD) or by sputtering. Then, a silicon film containing dopants becoming donors or acceptors was deposited by LPCVD and patterned into source and drain regions 203 (FIG. 2(a)). In the present Example 3, phosphorus was selected as a dopant. Phosphine (PH$_3$) and SiH$_4$ were mixed, and a silicon film containing the dopant was deposited as a 1500 Å-thick-film at 600° C. by LPCVD.

Subsequently, a channel portion silicon film 204 defining the active layer of a transistor was deposited by the LPCVD apparatus already described in detail in Example 1 in connection with FIG. 1 (FIG. 2(b)). In the present Example 3, SiH$_4$ was employed as a raw material gas. Diluting gas was not used at all. The silicon film 204 was deposited at 600° C. The substrate was inserted into the reaction chamber 101 in such a way that the front side of the substrate faced downward, while the chamber 101 was maintained at 400° C. At this time, pure nitrogen flowed out of the gas injection pipe 103 at 30 SLM to minimize the flow of air into the reaction chamber when the substrate was inserted.

After the insertion of the substrate, the operation of the turbomolecular pump was started. After the pump reached a steady condition, a leakage inspection was performed for 2 minutes. At this time, the leakage rate of desorbing gases was $3.0 \times 10^{-5}$ torr/min. Thereafter, the temperature was elevated from an insertion temperature of 400° C. to a deposition temperature of 600° C. in one hour. Gas was not admitted at all into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was $5.2 \times 10^{-7}$ torr. During the remaining 50 minutes of the temperature elevation period, nitrogen gas having a purity exceeding 99.9999% was continuously supplied at 300 SCCM. At this time, the equilibrium pressure inside the reaction chamber was $3.0 \times 10^{-3}$ torr. After reaching the deposition temperature, $SiH_4$ was supplied as a raw material gas at 50 SCCM, and a silicon film was deposited for 26 minutes 4 second.

During this operation, the conductance valve was kept fully open. The pressure inside the reaction furnace was measured with a capacitance manometer whose value is not dependent on the gas species. After introducing raw material gas $SiH_4$ into the reaction chamber, the equilibrium pressure inside the reaction chamber was 0.69 mtorr for 13 minutes 30 second. This measured pressure is substantially equal to the value of 0.67 mtorr obtained when $SiH_4$ was supplied at 50 SCCM and the temperature inside the reaction chamber was 25° C. Under these conditions, the relation of the thickness T (Å) of the deposited film to the deposition time t (in minutes) is given by $$T(\text{Å}) = -227(\text{Å}) + 20.6(\text{Å/min.}) \times t(\text{min.})$$

Therefore, we estimate that the raw material gas was not thermally decomposed for about 12 minutes after introducing the raw material gas into the reaction chamber. Then, the pressure inside the reaction chamber gradually increased and reached 0.86 mtorr when 26 minutes 00 second passed after the introduction of the raw material gas. The increase in the pressure inside the reaction chamber was attributed to an increase in the amount of produced hydrogen, which was caused by a variation in the reaction coefficient of the raw material silane. Taking account of this pressure variation, the reaction coefficient of the raw material silane immediately prior to the end of the decomposition is estimated at 31.5%. We estimate from this that the partial pressure of the silane was 0.45 mtorr. In the present example 3, 17 square glass plates with a length of 235 mm were inserted into the reaction chamber. The total internal area of the reaction chamber is 44040 cm². When it is assumed that the deposition rate is uniform over the whole interior of the reaction chamber, then from the deposition rate and from the total internal area of the reaction chamber, the reaction coefficient of the raw material silane and the partial pressure of the silane are estimated at 34.0% and 0.43 mtorr, respectively. The thickness of the obtained silicon film was 326 Å. This silicon film was patterned to form a channel portion 205 defining the active layer of a transistor (FIG. 2(c)).

Then, a gate-insulating film 206 was formed by ECR PECVD, APCVD, or other method. In the present Example 3, the gate-insulating film was formed by depositing $SiO_2$ to a thickness of 1500 Å by ECR PECVD (FIG. 2(d)). Subsequently, a thin film defining a gate electrode 207 was deposited by sputtering or by CVD. For this purpose, chromium (Cr) was deposited to a thickness of 1500 Å by sputtering. Thereafter, the thin film was patterned, and then an interlayer insulating film 208 having a thickness of 5000 Å was deposited. Then, contact holes were formed. Source and drain interconnection electrodes 209 were formed by sputtering. Thus, a thin-film semiconductor film was completed (FIG. 2(e)).

The transistor characteristics of the thin-film semiconductor device fabricated on a trial basis in this way were measured. The transistor was biased into on-state under the conditions Vds (source-drain voltage)=4 V and Vgs (gate voltage)=10 V. In this state, the source-drain current Ids is defined as the ON current $I_{ON}$. This ON current was $$I_{ON} = (3.63 + 0.12, -0.11) \times 10^{-6} A$$

with a confidence coefficient of 95%. The measurement was made at 25° C. on a transistor having a channel length L= 10 μm and a width W=10 μm. The effective electron mobility μ (J. Levinson et al. *J. Appl. Phys.* 53, p. 1193 (1982)) was $12.91 \pm 0.29$ cm²/V.sec. In this manner, a good thin-film semiconductor film was derived in accordance with the present invention.

Example 4

Figure 5:
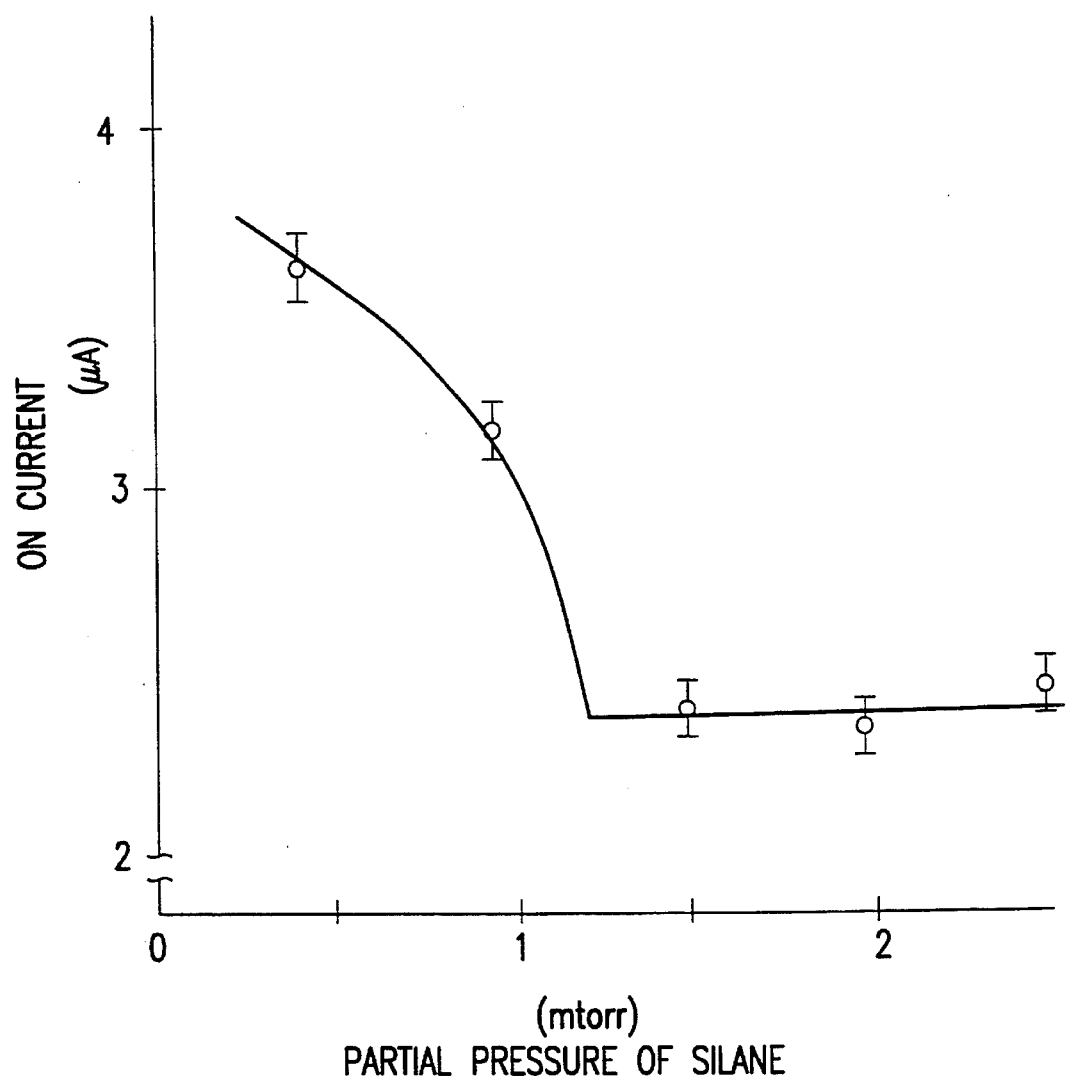
Figure 6:
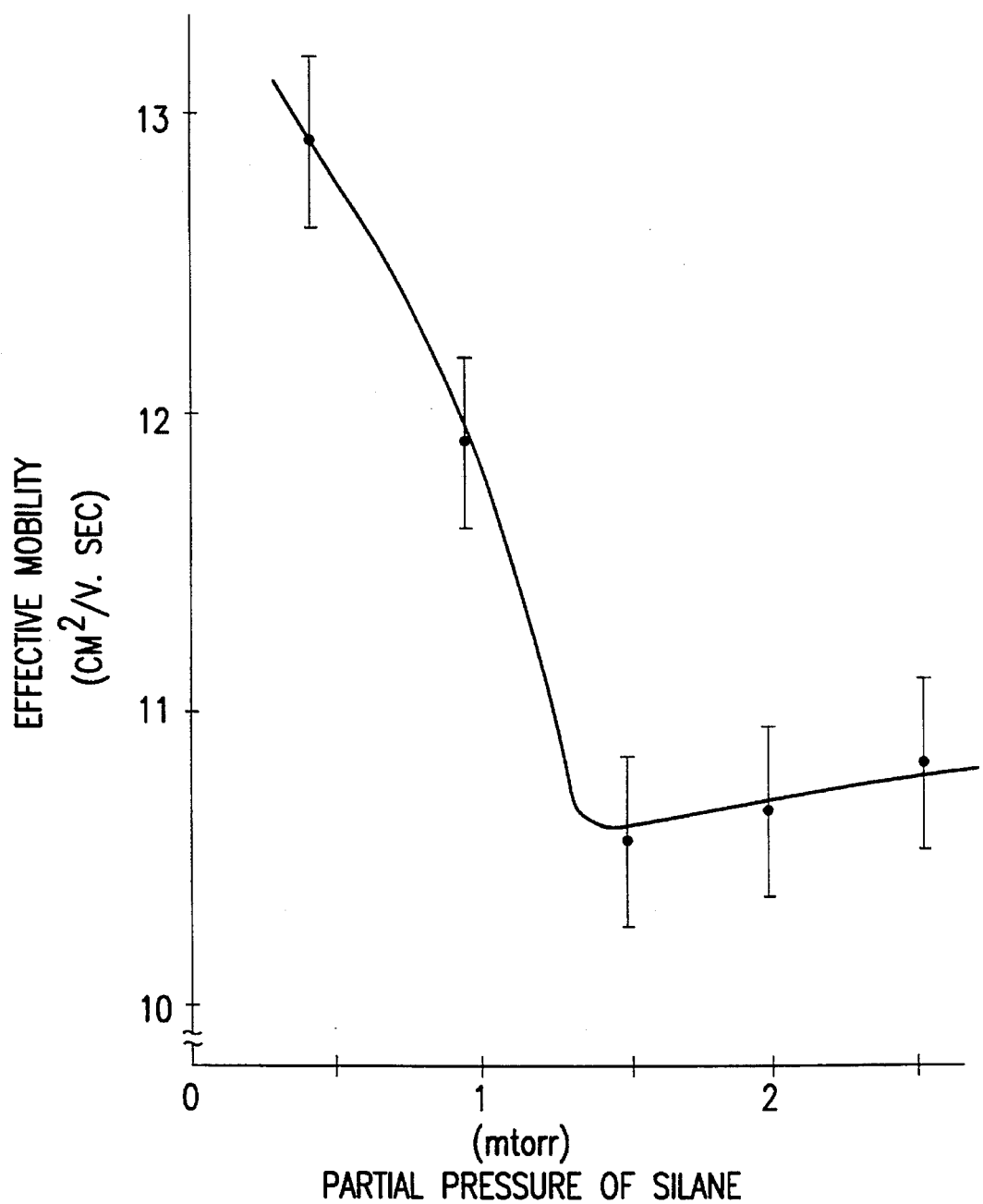

A thin-film semiconductor device was fabricated similarly to Example 3 except for the step of depositing the silicon film forming the channel portion. In this Example 4, to deposit the silicon film forming the channel portion, the LPCVD apparatus described in detail in Example 1 was used. The deposition temperature was 600° C. No diluting gas was employed. The flow rate of silane was changed from 100 SCCM to 250 SCCM in increments of 50 SCCM. Silicon was deposited until the thickness of the silicon film forming the channel portion became about 300 Å. In this way, a thin-film semiconductor device was fabricated. At this time, the conductance valve of the LPCVD apparatus was opened fully. Therefore, the pressure inside the reaction chamber, the deposition rate, the reaction coefficient of silane, and the partial pressure of silane vary, depending on the flow rate of the silane. The values of these factors for various samples are listed in Table 1. As examples of the transistor characteristics of the thin-film semiconductor device manufactured in this way, the ON current and the effective mobility defined in Example 3 are shown in Table 1 and FIGS. 5 and 6. In these table and figures, each error bar indicates the estimated interval value with a confidence coefficient of 95%. It can be seen from these table and figures that if the silicon film forming the channel portion is deposited under the condition that the partial pressure of silane is less than 1 mtorr or the pressure inside the reaction chamber is less than 2 mtorr, then the quality of the semiconductor film is improved greatly. Obviously, the corresponding transistor characteristics are enhanced greatly.

TABLE 1

| Sample No. | 3 | 4-1 | 4-2 | 4-3 | 4-4 |
|---|---|---|---|---|---|
| flow rate of silane (SCCM) | 50 | 100 | 150 | 200 | 250 |
| deposition time | 26'04" | 18'13" | 15'17" | 13'49" | 12'46" |
| silicon film thickness (Å) | 326 | 314 | 308 | 300 | 301 |
| reaction coefficient silane found from pressure change (%) | 31.5 | 26.4 | 24.7 | 19.7 | 16.7 |
| partial pressure of silane found from pressure change (mtorr) | 0.45 | 0.87 | 1.23 | 1.74 | 2.10 |
| reaction coefficient of silane found from deposition rate (%) | 34.0 | 21.9 | 15.4 | 12.6 | 10.0 |
| partial pressure of silane found from deposition rate (mtorr) | 0.43 | 0.96 | 1.49 | 1.98 | 2.52 |
| maximum pressure inside reaction chamber during deposition (mtorr) | 0.86 | 1.49 | 2.04 | 2.56 | 2.94 |
| ON current (95% C.L) (μA) | 3.63 ± 0.12 −0.11 | 3.10±0.12 −0.11 | 2.34±0.08 −0.07 | 2.31±0.08 −0.07 | 2.40±0.08 −0.07 |
| effective mobility (95% C.L) (cm$^2$/V · sec) | 12.91 ± 0.29 | 11.90±0.29 | 10.57±0.29 | 10.66±0.29 | 10.84±0.29 |

In order to obtain a high productivity, it is necessary to process as many glass plates as possible in one batch. For this purpose, the reaction coefficient of silane that is a raw material gas must be decreased and the variations in partial pressure of silane among the glass substrates must be reduced to a minimum to homogenize the film quality of every glass plate. More specifically, to attain high film quality and high productivity simultaneously, the raw material gas must be supplied at least at 100 SCCM to maintain the homogeneity among the glass plates. At the same time, the pressure inside the reaction furnace must be made less than 2 mtorr to deposit a film of high quality. As described in detail in Example 1, the novel vacuum-pumping machine has a pumping speed of 2200 l/sec for nitrogen. Therefore, when the flow rate of silane is 100 SCCM, the maximum pressure inside the reaction chamber is 1.49 mtorr. In this way, the two conditions are satisfied without difficulty. Generally, in order to satisfy the two conditions, the pumping speed of the vacuum-pumping machine must be in excess of 1650 l/sec.

Example 5

After depositing a film of SiO$_2$ on a substrate of molten quartz glass having a diameter of 3 inches, a silicon film was formed, and its physical properties were investigated. First, the quartz substrate was immersed in boiling nitric acid having a concentration of 60% for 5 minutes to remove contaminants from the surface of the substrate. Then, it was immersed in 1.67% aqueous solution of hydrofluoric acid for 20 minutes to remove the amorphous oxide film on the surface of the substrate. Immediately thereafter, SiO$_2$ was deposited as a 2000 Å-thick-film protecting the underlying layer by APCVD.

Then, a silicon film was deposited by the use of the novel LPCVD apparatus described in detail in Example 1 in conjunction with FIG. 1. In the present Example 5, SiH$_4$ was used as a raw material gas. The silicon film was formed at 555° C. without using diluting gas at all. Seventeen square substrates with the length of 235 mm were placed as dummy plates. The quartz substrate having a diameter of 3 inches was placed on the middle, ninth dummy plate as viewed from below in such a way that the front side of the substrate faced upward. The substrate was inserted in a reaction chamber 101 which was maintained at 400° C. At this time, pure nitrogen flowed out of the gas injection pipe 103 at 30 SLM to minimize the flow of air into the reaction chamber when the substrate was inserted.

After the insertion of the substrate, the operation of the turbomolecular pump was started. After the pump reached a steady condition, a leakage inspection was performed for 2 minutes. At this time, the leakage rate of desorbing gases was 4.45×10$^{-5}$ torr/min. Thereafter, the temperature was elevated from an insertion temperature of 400° C. to a deposition temperature of 555° C. in one hour. Gas was not admitted at all into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was 6.0×10$^{-7}$ torr. During the remaining 50 minutes of the temperature elevation period, nitrogen gas having a purity exceeding 99.9999% was continuously supplied at 300 SCCM. At this time, the equilibrium pressure inside the reaction chamber was 3.0× 10$^{-3}$ torr. After reaching the deposition temperature, SiH$_4$ was supplied as a raw material gas at 100 SCCM, and a silicon film was deposited for 15 hours 44 minutes 00 second.

During this operation, the conductance valve was kept fully open. The pressure inside the reaction furnace was measured with a capacitance manometer whose value is not dependent on the gas species. After introducing raw material gas SiH$_4$ into the reaction chamber, the equilibrium pressure inside the reaction chamber was 1.21 mtorr for the first 17 minute 30 second. This measured pressure is equal to the value obtained when SiH$_4$ was supplied at 100 SCCM and the temperature inside the reaction chamber was 25° C. Under these conditions, the relation of the thickness T (Å) of the deposited film to the deposition time t (in minutes) is given by $$T(\text{Å}) = -102(\text{Å}) + 5.63(\text{Å/min.}) \times t(\text{min.})$$

Therefore, we estimate that the raw material gas was not thermally decomposed for about 18 minutes after introducing the raw material gas into the reaction chamber. Then, the pressure inside the reaction chamber gradually increased and reached 1.26 mtorr when 15 hours 40 minutes passed after the introduction of the raw material gas, i.e., immediately prior to the end of the deposition. The increase in the pressure inside the reaction chamber was attributed to an increase in the amount of produced hydrogen, which was, in turn, caused by a variation in the reaction coefficient of the raw material silane. Taking account of this pressure variation, the reaction coefficient of the raw material silane immediately prior to the end of the decomposition is estimated at 3.4%. We estimate from this that the partial pressure of the silane was 1.17 mtorr. In the present Example 5, since 17 dummy square substrates with the length of 235 mm were inserted in the reaction chamber, the total internal area of the reaction chamber was 44040 cm$^2$. When it is assumed that the deposition rate is uniform over the whole interior of the reaction chamber, then from the deposition rate and the total internal area of the reaction chamber, the reaction coefficient of the raw material silane and the partial pressure of the silane are estimated at 4.6% and 1.15 mtorr, respectively. The thickness of the obtained silicon film was 5363 Å.

The crystal structure of the silicon film formed in this way was investigated by the X-ray diffraction method and by the Raman spectroscopy. In the X-ray diffraction method, intense peaks were observed when the diffraction angle 2θ (θ is the Bragg angle) was 28.47°, 47.44°, 56.18°, and 69.21°. These peaks correspond to {111}, {220}, {311}, and {400} diffractions of sample crystal powder and show that the silicon film obtained in this Example 5 is a polycrystalline film. The intensities of the peaks are 5118, 16760, 2787, and 498, respectively, in an arbitrary scale. We have found that the silicon film formed in Example 5 is oriented preferentially in the direction of the (110) plane. In the Raman spectroscopy, back scattering in a microscopic sample chamber was measured. To avoid annealing due to exciting laser radiation as well as peak shift and broadening of the half-width value due to temperature rise at the sample surface, the output power of the laser was set to a small value of 10 mW. At the same time, the beam diameter was set to 10 μm, which was the greatest value in the microscopic measurements. The measurements were made at 25° C. Wave number was scanned in a range from 600 cm$^{-1}$ to 100 cm$^{-1}$.

Raman spectroscopy described above have demonstrated that the silicon film obtained in Example 5 had a sharp peak having a half-width value of 4.27 cm$^{-1}$ at a wave number of 519.50 cm$^{-1}$. Obviously, the silicon film was polycrystalline. The crystallinity was found from the ratio of the integrated intensity of Raman scattering near optical mode vibration frequency 520 cm$^{-1}$ corresponding to the crystalline silicon to the total of the integrated intensity of scattering of the amorphous silicon in the acoustic transverse wave mode near vibration frequency 130 cm$^{-1}$, in the acoustic longitudinal wave mode near vibration frequency 290 cm$^{-1}$, in the optical transverse wave mode near vibration frequency 405 cm$^{-1}$, and in the optical transverse wave mode appearing near 480 cm$^{-1}$ (*Appl. Phys. Lett.* 40 (6), p. 534 (1982)). The crystallinity of the silicon film obtained in the present Example 5 was as high as 96.6%. In this measurement, the correction factor K for the integrated intensity of scattering was set to 0.88.

The results of the measurements of these physical properties have revealed that a crystalline silicon film which could never be formed unless the deposition temperature exceeded 580° C. can be formed below about 555° C. through the use of the novel LPCVD apparatus.

Then, phosphorus was added to the intrinsic silicon film obtained in Example 5, thus creating an electrical conductor. In Example 5, dopant ions were implanted, using a non-mass-separated ion implanter of the bucket type. As a raw material gas, phosphine having a concentration of 5% diluted with hydrogen was used. The ions were implanted at an acceleration voltage of 110 kV at a dose of 1.6×10$^{16}$ atoms/cm$^2$. The substrate was inserted into the furnace maintained at 400° C. in an ambient of nitrogen, and was thermally treated for 3 hours. The silicon film obtained in this way had a quite low sheet resistance of 185 Ω/□. The resistance value of the film formed by the prior art LPCVD at a deposition temperature below 580° C. was infinitely large though dopant ions such as phosphorus were added unless the film was thermally treated above 600° C. for tens of hours. Substantially no electrical current flowed through this film. On the other hand, where the silicon film formed by the novel LPCVD apparatus underwent the ion implantation according to the invention, a sufficiently low electrical resistance was derived by performing a low-temperature deposition at 555° C. and a low-temperature thermal treatment at 400° C. Accordingly, in accordance with the present invention, a silicon film which can be used in a thin-film semiconductor device, a large-scale integrated circuit (LSI), the gate electrodes and conductive interconnections of a charge-coupled device (CCD), or any other electronic device can be formed at low temperatures below about 555° C. Also, an electrical conductor can be created at such low temperatures. In this way, deterioration of the device due to high-temperature thermal treatment can be prevented. Furthermore, other devices and conductive interconnections can be formed from materials not highly resistant to heat. Consequently, the performance of these electronic devices can be improved, and the costs can be curtailed.

Example 6

FIGS. 2, (a)–(e), are cross-sectional views of a thin-film semiconductor device forming an MISFET, for illustrating steps successively performed to fabricate the device.

In this Example 6, the thin-film semiconductor device is of the non-self-aligned staggered structure. The present invention is also applicable to a thin-film semiconductor device of the reverse staggered structure and also to a thin-film semiconductor device of the self-aligned type.

In this Example 6, the glass plate or substrate 201 consists of a square quartz glass with a length of 235 mm. No limitations are imposed on the type or size of each substrate as long as it withstands the semiconductor film deposition temperature. First, a film 202 of silicon dioxide (SiO$_2$) defining an underlying layer-protecting film was formed on the substrate 201 by atmospheric pressure CVD (APCVD) or sputtering. Then, a silicon film containing dopants defining donors or acceptors was formed and patterned into source and drain regions 203 (FIG. 2(a)).

In the present Example 6, an intrinsic silicon film was deposited to a thickness of about 1500 Å at 555° C. by the use of the novel LPCVD apparatus described in detail in Example 1 in connection with FIG. 1. Then, phosphorus ions were implanted as dopant ions to form a doped silicon film. The intrinsic silicon film which would become source and drain regions was deposited at 555° C. for 4 hours 53 minutes 04 second while supplying SiH$_4$ as a raw material gas at 100 SCCM. The relation of the thickness T (Å) of the deposited film to the deposition time t (in minutes) was the same as the relation given in Example 5. In particular, the pressure inside the reaction chamber immediately after the introduction of the SiH$_4$ raw material gas into the reaction chamber which was retained at 555° C. was 1.21 mtorr. The pressure was 1.27 mtorr when 4 hours 52 minutes passed since the raw material gas had been introduced, i.e., immediately prior to the end of the deposition. The thickness of the intrinsic silicon film derived in this manner was 1571 Å. Subsequently, phosphorus ions were implanted, using a non-mass separated ion implanter of the bucket type. Phosphine having a concentration of 5% diluted with hydrogen was used as a raw material gas. Ions were implanted at a dose of 3×10$^{15}$ atoms/cm$^2$ at an RF output power of 38 W and at an acceleration voltage of 110 kV. Thereafter, the film was thermally treated at 400° C. for 1 hour 30 minutes in a nitrogen ambient. The sheet resistance of the doped silicon film obtained in this way was 936 Ω/□.

Subsequently, a silicon film 204 was deposited to form a channel portion defining the active layer of a transistor by the LPCVD apparatus already described in detail in Example 1 in connection with FIG. 1 (FIG. 2(b)). In the present Example 6, SiH$_4$ was employed as a raw material gas. Diluting gas was not used at all. The silicon film 204 was deposited at 555° C. The substrate was inserted into the reaction chamber 101 in such a way that the front side of the substrate faced downward, the chamber 101 being kept at 400° C. At this time, pure nitrogen flowed out of the gas injection pipe 103 at 30 SLM to minimize the flow of air into the reaction chamber when the substrate was inserted.

After the insertion of the substrate, the operation of the turbomolecular pump was started. After the pump reached a steady condition, a leakage inspection was performed for 2 minutes. At this time, the leakage rate of desorbing gases was 4.85×10$^{-5}$ torr/min. Thereafter, the temperature was elevated from an insertion temperature of 400° C. to a deposition temperature of 555° C. in one hour. Gas was not admitted at all into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was 6.4×10$^{-7}$ torr. During the remaining 50 minutes of the temperature elevation period, nitrogen gas having a purity exceeding 99.9999% was continuously supplied at 300 SCCM. At this time, the equilibrium pressure inside the reaction chamber was 3.0× 10$^{-3}$ torr.

After reaching the deposition temperature, SiH$_4$ was supplied as a raw material gas at 100 SCCM, and a silicon film was deposited for 58 minutes 23 second. During this operation, the conductance valve was kept fully open. The pressure inside the reaction furnace was measured with a capacitance nanometer whose reading is not dependent on the gas species. After introducing the raw material gas SiH$_4$ into the reaction chamber, the equilibrium pressure inside the reaction chamber was 1.21 mtorr for 17 minutes 30 second. The relation of the thickness T (Å) of the deposited film to the deposition time t (in minutes) was the same as the relation given in Example 5. The equilibrium pressure inside the reaction chamber after 58 minutes 00 second passed since the raw material gas had been introduced, i.e., immediately prior to the end of the deposition, was 1.27 mtorr. As described in Example 5, when it is assumed that the deposition rate is uniform over the whole interior of the reaction chamber, then from the deposition rate and from the total internal area of the reaction chamber, the reaction coefficient of the raw material silane and the partial pressure of the silane are estimated at 4.6% and 1.15 mtorr, respectively. The thickness of the obtained silicon film was 199 Å. This silicon film was patterned to form the silicon film 205 for producing a channel portion defining the active layer of a transistor (FIG. 2(c)).

Then, a gate-insulating film 206 was formed by ECR PECVD, APCVD, or other method. In the present Example 6, the gate-insulating film was formed by depositing SiO$_2$ to a thickness of 1500 Å by ECR PECVD (FIG. 2(d)). Subsequently, a thin film defining a gate electrode 207 was deposited by sputtering or by CVD. For this purpose, chromium (Cr) was deposited to a thickness of 1500 Å by sputtering. Thereafter, the thin film was patterned, and then an interlayer insulating film 208 having a thickness of 5000 Å was deposited. Then, contact holes were formed. Source and drain interconnection electrodes 209 were formed by sputtering. Thus, a thin-film semiconductor film was completed (FIG. 2(e)).

The transistor characteristics of the thin-film semiconductor device fabricated on a trial basis in this way were measured. The transistor was biased into the on-state under the conditions Vds (source-drain voltage)=4 V and Vgs (gate voltage)=10 V. In this state, the source-drain current Ids is defined as the ON current $I_{ON}$. This ON current was $$I_{ON}=(1.45+0.08, -0.07)\times 10^{-6} A$$

with a confidence coefficient of 95%. When the transistor was driven into the off-state under the conditions Vds=4 V and Vgs=0 V, the OFF current was $$I_{OFF}=(0.079+0.030, -0.022)\times 10^{-12} A$$

The measurement was made at 25° C. on a transistor having a channel length L=10 μm and a width W=10 μm. The effective electron mobility μ (J. Levinson et al. *J. Appl. Phys.* 53, p. 1193 (1982)) was 9.30±0.39 cm$^2$/V.sec. Thus, the source-drain current Ids of the thin-film semiconductor device varied by more than seven orders of magnitude with a modulation of 10 V of the gate voltage. This is a quite excellent property. In addition, this device could be made by a low-temperature process in which the maximum temperature of less than 555° C. was maintained within several hours. The present invention not only improves the performance of the semiconductor film and of the thin-film semiconductor device but also makes it possible to mass-produce them stably in a low-temperature process which would have been heretofore considered totally impossible to realize.

Example 7

FIGS. 8, (a)–(d), are cross-sectional views of a thin-film semiconductor device forming an MISFET, for illustrating steps successively performed to fabricate the device.

In the present Example 7, a substrate 801 is made of a sheet of square quartz glass with a length of 235 mm. No limitations are imposed on the type or size as long as the substrate can withstand a high temperature of 555° C. for about three hours. First, a film 802 of silicon dioxide (SiO$_2$) defining an underlying layer-protecting film was formed on the substrate 801 by atmospheric pressure CVD (APCVD), sputtering, or other method. In this Example 7, SiO$_2$ was deposited to a thickness of 2000 Å at a substrate temperature of 300° C. at a deposition rate of 3.9 Å/sec by APCVD to form the underlying layer-protecting film 802.

Then, a semiconductor film 803 was formed by the use of the novel LPCVD apparatus described in detail in Example 1. In the present Example 7, the semiconductor film is an intrinsic silicon film. It can also be other semiconductor films such as a silicon germanium film or a gallium arsenide film. Also, the semiconductor film may contain a trace amount of dopant less than about $1 \times 10$ atoms/cm$^3$ which makes the film p- or n-type. In the present Example 7, a silicon film was deposited at 555° C. for 2 hours 5 minutes 26 second while supplying silane at 100 SCCM. For the deposition, the temperature was elevated from an insertion temperature of 400° C. to a deposition temperature of 555° C. in one hour. Gas was not admitted at all into the reaction chamber during the first 10 minutes of the temperature elevation operation. The temperature elevation was carried out in a vacuum for the first 10 minutes. The lowest attainable base pressure inside the reaction chamber after 10 minutes of the temperature elevation operation was $6.1 \times 10^{-7}$ torr. During the remaining 50 minutes of the temperature elevation period, nitrogen gas having a purity exceeding 99.9999% was continuously supplied at 300 SCCM. At this time, the equilibrium pressure inside the reaction chamber was $3.0 \times 10^{-3}$ torr. When 2 hours 5 minutes passed after the introduction of the raw material gas immediately prior to the end of the deposition, the equilibrium pressure inside the reaction chamber was 1.26 mtorr. The thickness of the semiconductor film obtained in this manner was 588 Å. Then, this semiconductor film was patterned to form a semiconductor film 803 defining a transistor (FIG. 8(a)).

Then, a gate-insulating film 804 was formed by ECR PECVD, APCVD, or other method. In the present Example 7, the gate-insulating film was formed by depositing SiO$_2$ to a thickness of 1500 Å at a substrate temperature of 100° C. by ECR PECVD. Subsequently, a conductive film defining a gate electrode was formed, followed by formation of a film defining a cap layer. When dopant ions becoming donors or acceptors would subsequently be implanted into the semiconductor film, using the gate electrode as a mask, the cap layer would prevent these dopant ions from reaching the channel portion. Accordingly, if the gate electrode is capable of stopping implantation of dopant ions as encountered when the gate electrode is thick, then this cap layer is not necessary. In the present Example 7, the gate electrode 805 was a film having a thickness of 2000 Å and made of indium tin oxide (ITO). The cap layer 806 consisted of SiO$_2$ and had a thickness of 3500 Å. The gate electrode 805 was formed at a substrate temperature of 150° C. by sputtering. The cap layer 806 was formed by depositing SiO$_2$ at a substrate temperature of 300° C. by APCVD. Then, this film was patterned to form the gate electrode 805 and the cap layer 806 (FIG. 8(b)). The gate can also be made of a metal such as chromium, tungsten, or molybdenum or a silicide such as molybdenum silicide or tungsten silicide. When these films are thicker than approximately 3500 Å, the above-described cap layer is dispensed with. Furthermore, it is advantageous to form the gate electrode by sputtering pure aluminum to a thickness of about 8000 Å. Also in this case, the cap layer is unnecessary. The cap layer may also consist of silicon nitride, SiON, or a metal oxide, as well as SiO$_2$ used in the present Example 7.

Then, dopant ions becoming donors or acceptors were implanted into the semiconductor film 803, using the gate electrode 805 as a mask by a non-mass-separated ion implanter of the bucket type. This produced a source/drain region 808 and a channel region 807 which were self-aligned relative to the gate electrode 805 (FIG. 8(c)). In the present Example 7, fabrication of an n-type MOS was attempted and, therefore, phosphine (PH$_3$) having a concentration of 5% and diluted with hydrogen was used as a raw material gas. The raw material gas may also be any other hydride of a dopant diluted with hydrogen. For instance, diborane (B$_2$H$_6$) diluted with hydrogen can be used to fabricate a p-type MOS. In the present Example 7, the raw material gas was changed into a plasma at 13.56 MHz and at an RF output power of 50 W. All the ion species including PH$_3^+$, PH$_2^+$, PH$^+$, H$_2^+$, and H$^+$ were lodged into the semiconductor film at an accelerating voltage of 110 kV and at a dose of $2 \times 10^{16}$ atoms/cm$^2$. Then, the substrate was annealed in a nitrogen ambient at 350° C. for 2 hours, thus completing the source/drain region 808. The sheet resistance of the source/drain region after the anneal was 17.01 k$\Omega/\square$.

Then, an interlayer insulating film 809 was deposited as a 5000 Å-thick-film at 300° C. by APCVD. Contact holes were formed. Source and drain interconnection electrodes 810 were formed, thus completing a thin-film semiconductor device. In the present Example 7, aluminum was deposited at a substrate temperature of 180° C. to a thickness of 8000 Å by sputtering and then patterned to form the source and drain interconnection electrodes 810.

The transistor characteristics of the thin-film semiconductor device fabricated on a trial basis in this way were measured. The transistor was biased into the on-state under the conditions Vds (source-drain voltage)=4 V and Vgs (gate voltage)=10 V. In this state, the source-drain current Ids is defined as the ON current. The channel length and the width of the transistor were both 10 µm. For this transistor, $I_{ON}=5.62 \times 10^{-7}$ A at room temperature. The effective electron mobility µ found from the saturation current region of this thin-film semiconductor device was 6.87±0.35 cm$^2$/V.sec with a confidence coefficient of 95%. The OFF current of this transistor when it was driven into off-state under the conditions Vds=4 V and Vgs=0 V was $8.48 \times 10^{-13}$ A. In this way, many self-aligned thin-film semiconductor devices on a large substrate could be fabricated uniformly by a short-time low-temperature process in which the highest temperature was 555° C. and this temperature was maintained for only about 2 hours. Since the highest temperature in the subsequent steps after the formation of the good semiconductor film 803 at 555° C. was suppressed to 350° C. in the anneal performed in a nitrogen ambient for the activation of the dopant ions, it is not necessary for the present process to process the substrates to the hydrogenation step or laser illumination, which cause variations among the completed devices, which can lead to variation in processing, and which normally deteriorate the throughput. In the present invention, the most severe thermal environment persists only for a few hours at 555° C. Therefore, even if a relatively cheap glass sheet is used as a substrate, the elongation, shrinkage, and distortion of the substrate do not present problems. In consequence, a thin-film semiconductor device having a large area, high definition, and high density can be fabricated economically.

Example 8

As described in detail in Examples 1–7, as the effective pumping speed in the reaction chamber increases, a good semiconductor film can be deposited at a lower temperature. Thus, uniform, excellent thin-film semiconductor devices can be stably fabricated on a cheap substrate having a large area.

Figure 11:
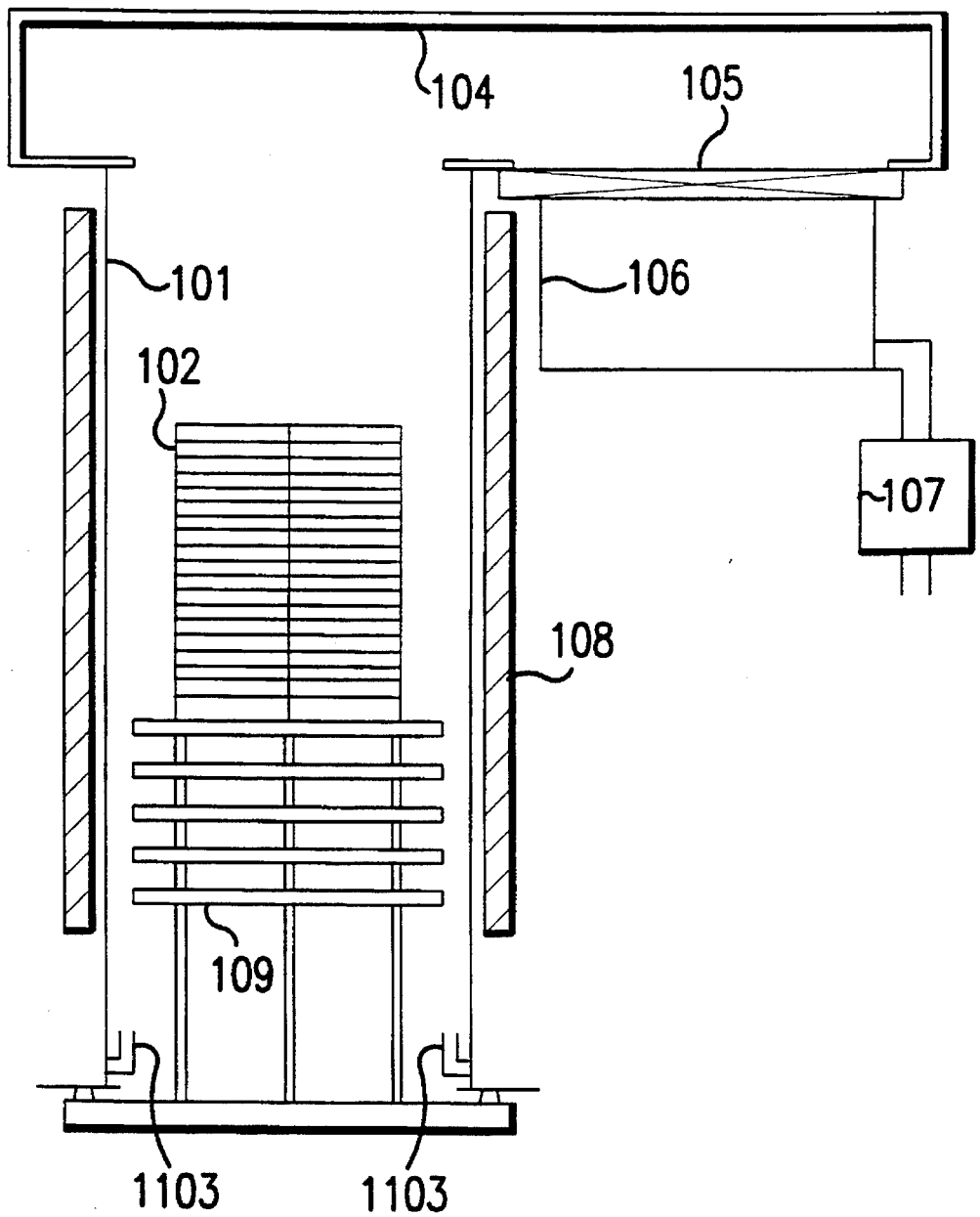
FIG. 11 is a schematic side elevation of a vertical LPCVD apparatus according to the invention.

FIG. 11 conceptually illustrates a vertical low-pressure CVD apparatus having such excellent functions according to the invention. This LPCVD apparatus has a reaction chamber 101. Substrates 102 are placed horizontally near the center of the reaction chamber 101. A semiconductor film such as a silicon film is deposited by utilizing thermal decomposition of a raw material gas such as silane, disilane, or germane. This gas and a diluting gas such as nitrogen, hydrogen, or argon are admitted into the reaction chamber from gas injection holes 1103 located near the bottom of the reaction chamber. Each substrate 102 is placed on a turntable 109 consisting of a combination of plural disks. During the deposition of the semiconductor film, the turntable and the substrates make several revolutions per minute. The raw material gas forced into the reaction chamber flows between the turntable and the inner wall of the reaction chamber and reaches the substrates. Then, the raw material gas is evacuated by a manifold 104 or vacuum pump located at the top of the reaction chamber. In the present Example 8, the manifold or vacuum pump is the same as the manifold or vacuum pump used with the LPCVD apparatus described in detail in Example 1. As described later, the manifold may be omitted. Also, other combinations of pumps are possible. A heater 108 divided into several portions is installed outside the reaction chamber. A desired temperature region can be formed inside the reaction chamber by controlling the temperatures in these heater portions independently. For example, the heater 108 is vertically divided into 5 portions. The temperature is successively increased from the lowest portions to the uppermost portions of the heater to provide a temperature gradient inside the reaction chamber such that the temperature rises at a given rate from the lowermost substrate to the uppermost substrate. Of course, a uniform temperature region in which the temperature is uniform between successive substrates can be formed.

In the vertical LPCVD apparatus described in the present Example 8, gas flows upwardly. Strictly, therefore, the pressure inside the reaction chamber drops with increased height. In order to obtain a good semiconductor film as described above, it is desired to deposit the material at a lower pressure with a maximum pumping speed. In the LPCVD apparatus shown in FIG. 11, gas is pumped out from the top of the apparatus and so the conductance between the turntable and the wall of the reaction chamber presents no problem. The substrates directly experience the pumping speed in the manifold extending from the reaction chamber intake holes. Consequently, a semiconductor film can be formed in a still higher vacuum. In accordance with the present invention, gas is evacuated from the whole top surface of the reaction chamber, thus greatly suppressing convection inside the reaction chamber. This improves the uniformity in film quality among the substrates. When a semiconductor film is deposited, the molecular weight of a reacting gas such as silane ($SiH_4$) or dichlorosilane ($SiH_2Cl_2$) is generally larger than the molecular weights of produced gases such as hydrogen ($H_2$) and hydrogen chloride (HCl). In the method in which the exhaust pipe of the conventional LPCVD apparatus stands upright as shown in FIG. 7, the produced gases stay in the upper portion of the reaction chamber. Thus the ratio of the reacting gas to the produced gases in the conventional LPCVD chamber varies with time during the deposition. In the novel LPCVD apparatus shown in FIG. 11, the produced gases do not stay and, therefore, the deposition state can be controlled well throughout the period of the deposition. In general, the pumping speed is lower for gases having smaller molecular weights such as hydrogen. If these gases stay in the reaction chamber, then the pumping speed that the substrates experience will drop. In the novel LPCVD apparatus, gases are pumped out from the top of the chamber. Therefore, these light gases can be effectively evacuated. Consequently, the pumping speed that the substrates themselves experience can be increased to a maximum. In this way, a semiconductor film of higher quality can be deposited at a low temperature lower than about 555° C. by the novel LPCVD apparatus. Further, the deposition rate can be increased.

Example 9

Figure 12:
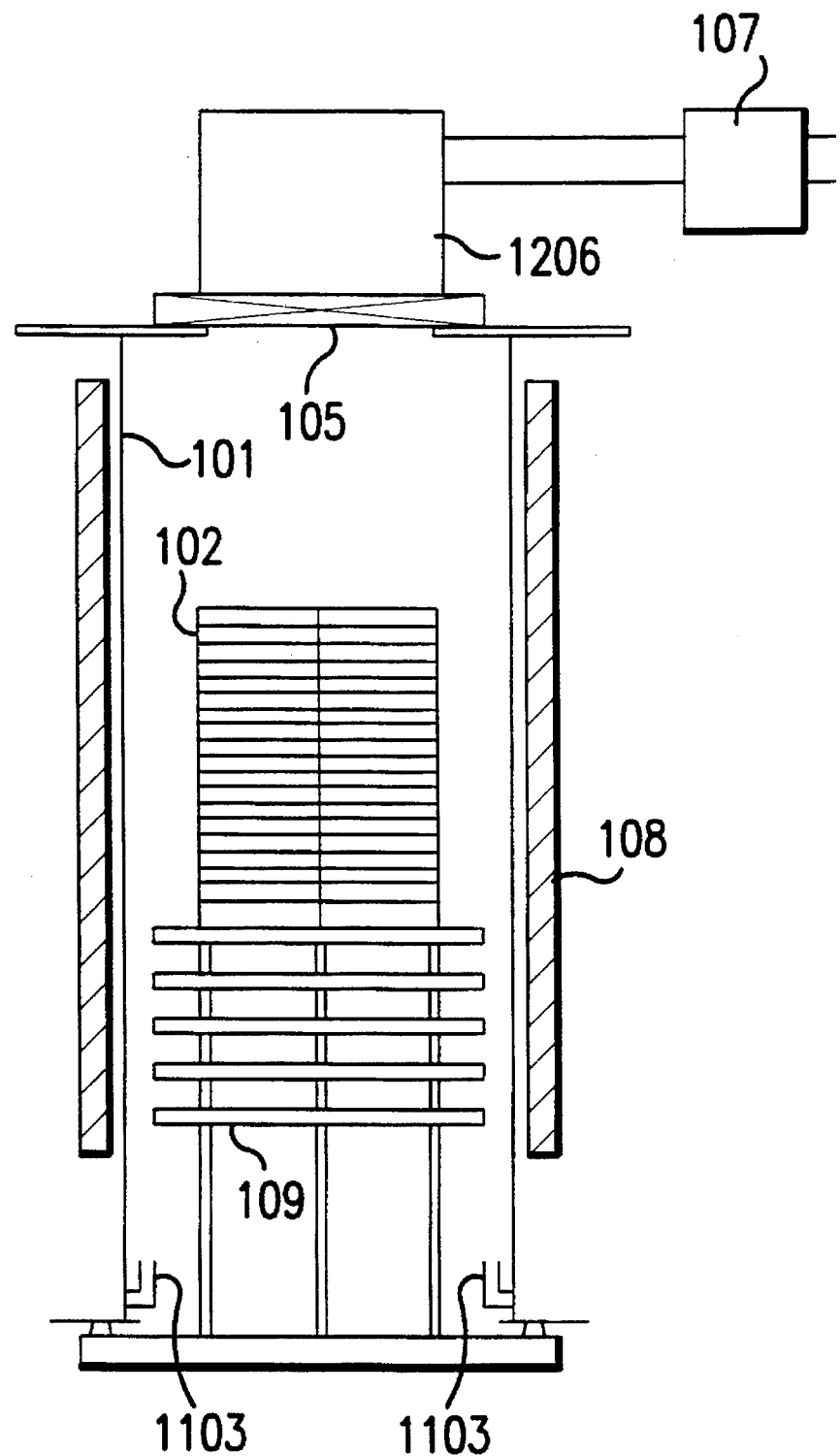
FIG. 12 is a schematic side elevation of another vertical LPCVD apparatus according to the invention.

FIG. 12 conceptually illustrates a vertical low-pressure CVD apparatus according to the invention. As described in detail in Example 8, to form a semiconductor film of high quality at a higher efficiency, it is desired to introduce a raw material gas from the bottom of a reaction chamber by a vertical LPCVD apparatus having high pumping capability and to pump out gas from a large portion of the top chamber of the reaction surface. The LPCVD apparatus shown in FIG. 12 has no manifold. A magnetic bearing turbomolecular pump 1206 such as a magnetic bearing composite molecular pump TG2203MV manufactured by Osaka Vacuum Ltd., Japan, is mounted in the reaction chamber via a gate valve and a conductance valve 105 which are mounted to the top surface of the reaction chamber. The magnetic bearing turbomolecular pump can be used in an inverted posture. This permits upward flow of gas, which, in turn, facilitates uniform deposition. Also, light molecules can be pumped out at a high speed. Furthermore, the effect of the fluid resistance produced in the manifold and between the turntable and the reaction chamber wall on the substrates is eliminated completely. As a result, a maximum pumping speed is obtained at the positions of the substrates. Where the above-described magnetic bearing turbomolecular pump was used, the pumping speed Sp in the intake hole of the pump was 2200 l/sec. Since the conductance Cv of the gate valve and of the conductance valve was 3150 l/sec, the effective pumping speed Se in the reaction chamber is $1/Se=1/Sp+1/Cv$ Thus, Se=1295 l/sec. This is larger than the pumping speed of the novel LPCVD apparatus (FIG. 1) of Example 1. Also, in the novel LPCVD apparatus of Example 9 (FIG. 12), the difference between the pressure in the pump intake hole and the pressure at the positions of the substrates is much smaller than the pressure difference produced in the conventional LPCVD apparatus and the pressure difference produced in the LPCVD apparatus shown in FIG. 1. It substantially follows that deposition at lower pressure is enabled. Consequently, semiconductor films of high quality and excellent thin-film semiconductor device can be quite easily and stably manufactured.

Example 10

Figure 13:
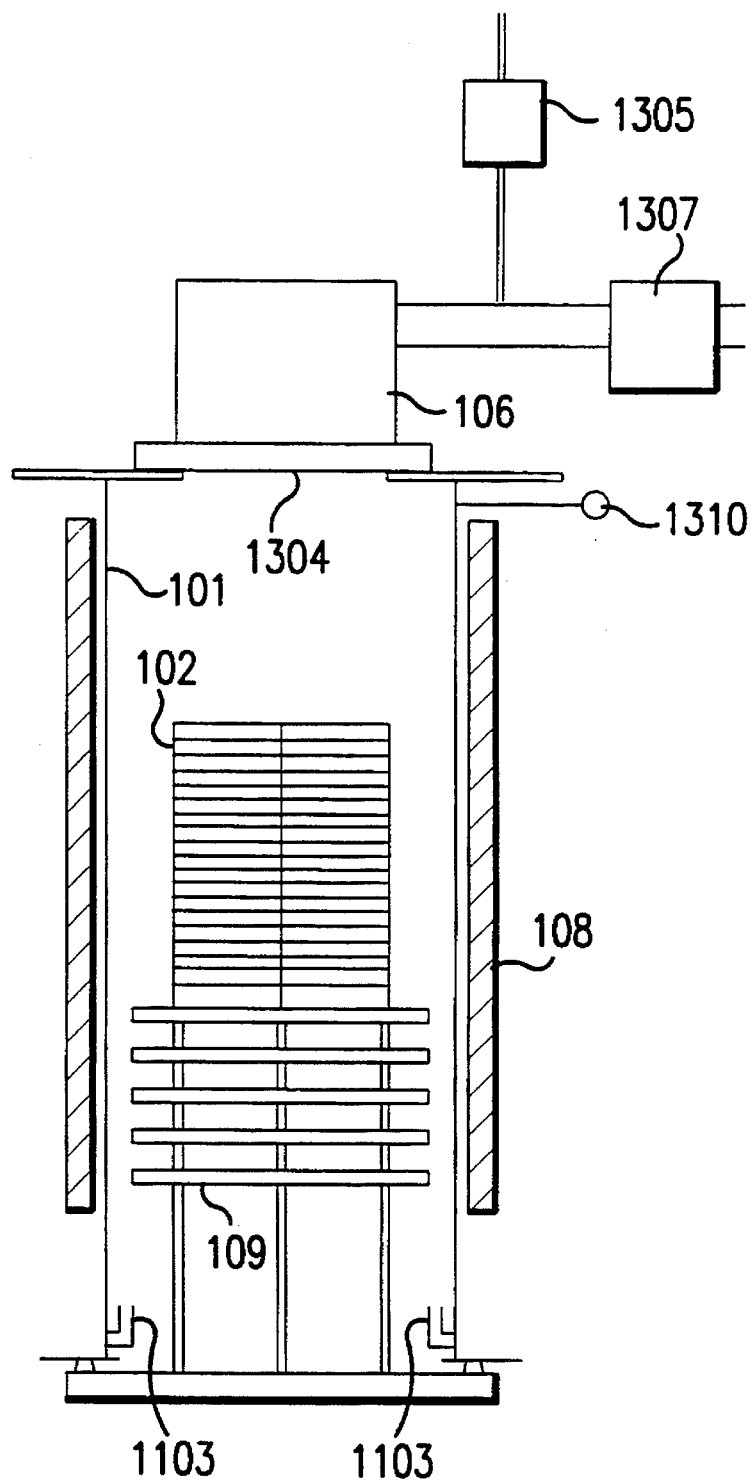
FIG. 13 is a schematic side elevation of a CVD apparatus according to the invention.
Figure 14:
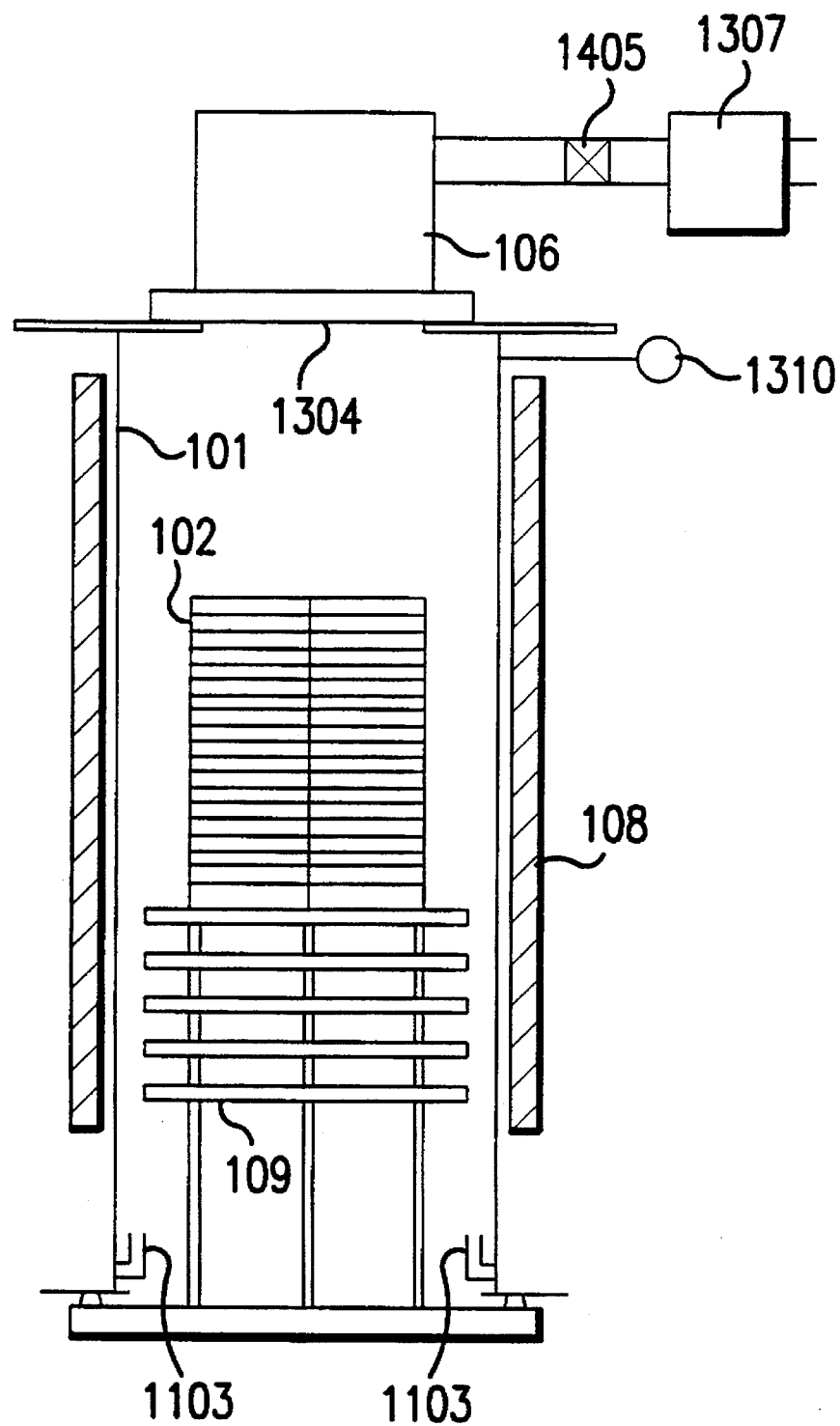
FIG. 14 is a schematic side elevation of another CVD apparatus according to the invention.

FIGS. 13 and 14 conceptually illustrate examples of CVD apparatus according to the invention. In the present Example 10, an LPCVD apparatus is used by way of example. The invention can also be applied to a plasma-enhanced CVD apparatus, photo-assisted CVD apparatus, and other CVD apparatus.

The illustrated LPCVD apparatus comprises a vertical furnace having a reaction chamber 101. Substrates 102 are installed around the center of the reaction chamber 101. In FIGS. 13 and 14, the substrates are placed horizontally on a turntable 109. The substrates can also be placed vertically or obliquely. A heater 108 is mounted outside the reaction chamber. A raw material gas is introduced into the reaction chamber from gas injection holes 1103. The inside of the chamber is evacuated by a turbomolecular pump 106 via a gate valve 1304. This turbomolecular pump is evacuated by a second vacuum pump 1307. In the present Example 10, a rotary pump is used as the second vacuum pump. A dry pump or other pump may also be used instead. The pressure inside the reaction chamber is measured with a pressure gauge 1310. In the conventional LPCVD apparatus, the conductance valve that regulates the pressure inside the reaction chamber is mounted between the reaction chamber and the turbomolecular pump. In the present invention, a pressure-adjusting device for adjusting the pressure inside the reaction chamber is mounted at the exhaust port of the turbomolecular pump. Since the pumping speed at the intake hole of the turbomolecular pump has a negative correlation with the pressure in the exhaust port of the pump, if the pressure in the exhaust port is increased, the pumping speed at the intake hole decreases. As a result, the pressure inside the reaction chamber increases. Conversely, if the pressure in the exhaust port is lowered, the pumping speed is increased, thereby reducing the pressure inside the reaction chamber. Therefore, the pressure inside the reaction chamber can be easily adjusted by adjusting the pressure in the exhaust port of the turbomolecular pump. In FIG. 13, a gas flow adjuster 1305 is mounted at the exhaust port of the turbomolecular pump 106 to pass an inert gas of high purity such as helium, nitrogen, argon into the exhaust port at an appropriate flow rate. This flow rate of gas is adjusted by the gas flow adjuster according to the difference between the desired pressure inside the reaction chamber and the pressure actually measured with the pressure gauge 1310. Accordingly, when the gas flow adjuster 1305 fully stops the supply of gas into the exhaust port of the pump, the pumping speed at the intake hole of the pump is made maximum. In FIG. 14, a conductance valve 1405 is mounted at the exhaust port of the turbomolecular pump. In the same way as the foregoing, the opening of the conductance valve 1405 is adjusted according to the difference between the desired pressure inside the reaction chamber and the pressure actually measured with the pressure gauge 1310. When the conductance valve 1405 is fully open, the pumping speed at the intake hole of the pump is maximized. The pressure adjuster can utilize the above-described gas introduction, a conductance valve, or a combination of them. In this way, a higher deposition pressure is permitted.

Usually, one CVD apparatus is required to deposit various films under various conditions. In this case, it is desired to accommodate as many deposition conditions as possible. For example, as for deposition pressure, one apparatus preferably accommodates itself to a wide range of pressures from a low pressure to a high pressure. The novel CVD apparatus can deposit films over such a wide range of pressures. Also, the apparatus can accomplish high pumping speed and low pressure at the same time.

Where the magnetic bearing turbomolecular pump described in Example 9 is used as the turbomolecular pump 106, only the gate valve 1304 exists between the pump and the reaction chamber. Since the conductance $C_G$ of this gate valve 1304 is 10500 l/sec, the effective pumping speed Se in the reaction chamber is as large as 1819 l/sec when a maximum pumping speed should be derived. When nitrogen is supplied into the reaction chamber at about 100 SCCM, the equilibrium pressure inside the reaction chamber is $8.4 \times 10^{-4}$ torr. In this way, deposition at extremely low pressure is permitted. As described already in Example 9 and previous examples, a raw material gas is admitted into the reaction chamber at a relatively high flow rate of about 100 SCCM. This feature is combined with the deposition at extremely low pressure to form a good semiconductor film at a lower temperature. Where an intrinsic silicon film is deposited, if monosilane is supplied as a raw material gas at about 100 SCCM, and if the deposition temperature is 555° C., then the partial pressure of silane during the deposition is on the order of 0.8 mtorr. Since the pressure is lower than the pressure at which the polycrystalline silicon film is formed at the same temperature as described in Example 5, the formed polycrystalline film of high quality having larger grain diameters is produced at a higher degree of crystallization. Furthermore, a thin-film semiconductor device having excellent characteristics can be easily fabricated by a low-temperature process.

In the novel LPCVD apparatus shown in FIG. 13, nitrogen having a purity exceeding approximately 99.9995% was supplied into the exhaust port of a turbomolecular pump at 1.4 SLM via the gas flow adjuster 1305. Monosilane was introduced as a raw material gas into the reaction chamber from the gas injection holes 1103 at 100 SCCM. The pressure at the exhaust port of the pump was as high as 1.12 torr. Correspondingly, the pressure inside the reaction chamber was 0.45 torr. When the deposition temperature was 555° C. in the same way as in the previous examples, an amorphous silicon film was obtained by deposition. When the aforementioned nitrogen was supplied into the exhaust port of the turbomolecular pump at 2.9 SLM via the gas flow adjuster 1305, and the raw material gas was introduced into the reaction chamber at 100 SCCM from the gas injection holes 1103, the pressure in the exhaust port of the turbomolecular pump was 2.01 torr and the pressure inside the reaction chamber was 1.6 torr. In the novel CVD apparatus, if the flow rate of the raw material gas supplied into the reaction chamber from the gas injection holes 1103 is maintained at 100 SCCM, for example, then the single apparatus can set the pressure inside the reaction chamber within the wide range from an extremely low pressure of $8.4 \times 10^{-4}$ torr to a relatively high pressure of 1.6 torr. Indeed, the ratio of the minimum pressure to the maximum pressure reaches 2000. Accordingly, the novel single CVD apparatus can form various semiconductor films, ranging from highly crystalline polycrystalline semiconductor films to amorphous semiconductor films. Where a deposition is made at a relatively high pressure, temperature elevation before the deposition is done at a high pumping speed at an extremely low pressure. Thus, the base pressure can be maintained less than about $10^{-7}$ torr above 400° C. Consequently, gases desorbing from the substrates and from the inner wall of the reaction chamber and other trace amounts of leaking gases can be pumped out sufficiently quickly. This facilitates forming a semiconductor film of high purity.

On the other hand, in the conventional LPCVD apparatus shown in FIG. 7, when the raw material gas was supplied into the reaction chamber at 100 SCCM, the minimum deposition pressure was 33 mtorr. The maximum pressure obtained by fully closing the conductance valve was 0.9 torr. The ratio of the minimum pressure to the maximum pressure is only 27. When the deposition temperature was 555° C. and monosilane was used as a raw material gas, the conventional LPCVD apparatus can deposit no films other than amorphous silicon films. In the LPCVD apparatus shown in FIG. 1 and having a high pumping speed, when the conductance valve is located between the reaction chamber, or the manifold, and the turbomolecular pump, the raw material gas was supplied into the reaction chamber from the gas injection holes 103 at 100 SCCM. The minimum pressure and the maximum pressure obtained by adjusting the conductance valve were 1.2 mtorr and 12 mtorr, respectively. Since the device for adjusting the pressure inside the reaction chamber is mounted at the exhaust port of the turbomolecular pump in this way, the pressure range is increased greatly. As a result, the single CVD apparatus can form various types of semiconductor films. At the same time, semiconductor films of higher quality can be formed by extremely low pressure deposition.

Example 11

Figure 15:
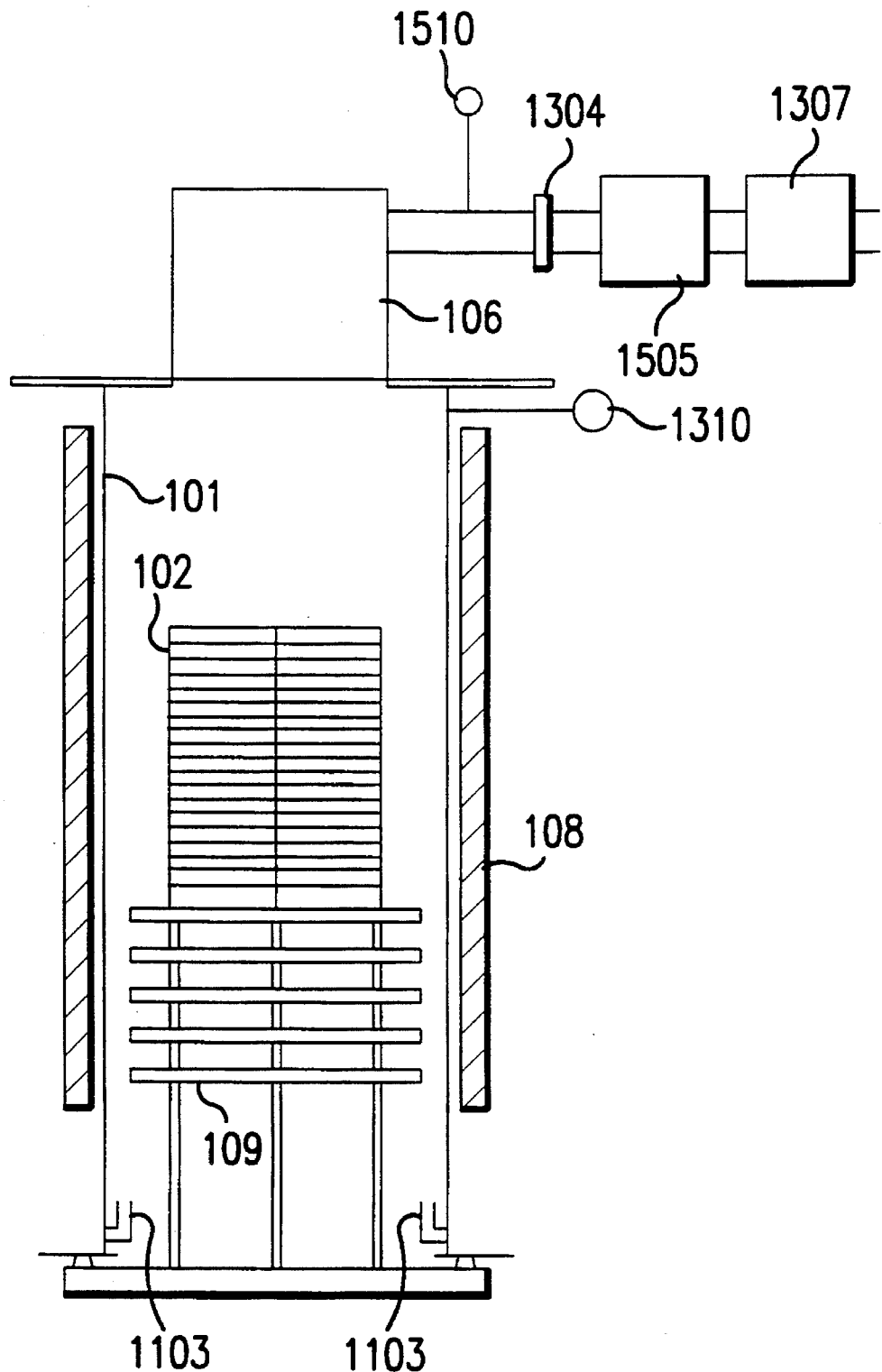
FIG. 15 is a schematic side elevation of a further CVD apparatus according to the invention.

FIG. 15 conceptually illustrates a CVD apparatus according to the invention. In the Example 11, an LPCVD apparatus is used. The invention can also be applied to a plasma-enhanced CVD apparatus, a photo-assisted CVD apparatus, or other CVD apparatus.

The illustrated LPCVD apparatus comprises a vertical furnace having a reaction chamber 101. Substrates 102 are installed around the center of the reaction chamber 101. In FIG. 15, the substrates are placed horizontally on a turntable 109. The substrates can also be placed vertically or obliquely. A heater 108 is mounted outside the reaction chamber. A raw material gas is introduced into the reaction chamber from gas injection holes 1103. The inside of the chamber is evacuated by a turbomolecular pump 106 mounted directly in the reaction chamber. This turbomolecular pump is evacuated by a second vacuum pump 1307. In the present Example 11, a rotary pump is used as the second vacuum pump. A dry pump or other pump may also be used instead. The pressure inside the reaction chamber is measured with a pressure gauge 1310. In the conventional LPCVD apparatus, the gate valve is disposed between the reaction chamber and the turbomolecular pump. In the present invention, the gate valve 1304 is located at the exhaust port of the turbomolecular pump. A pressure adjuster 1505 which adjusts the pressure inside the reaction chamber is mounted between the gate valve 1304 and the second vacuum pump 1307. The pressure adjuster can make use of addition of a given amount of an inert gas of high purity or the use of a conductance valve. The pressure adjuster operates according to the difference between the pressure actually measured with the pressure gauge 1310 and the desired pressure.

One example of a sequence of operations performed to operate the novel CVD apparatus is next described. After inserting the substrates, the gate valve 1304 is opened. At this time, the second vacuum pump 1307 is operating steadily and roughly evacuates the inside of the reaction chamber through the turbomolecular pump 106. The pressure inside the reaction chamber can be either atmospheric pressure or a vacuum such as about 1 torr when the gate valve is open. Simultaneously with opening of the gate valve, the pump 106 is started to be operated. After the pump has reached a steady condition, the gate valve 1304 is closed from several seconds to several minutes. Leakage into the reaction chamber is checked by the pressure gauge 1510 mounted between the turbomolecular pump 106 and the gate valve 1304. If leakage is not detected, the valve 1304 is again opened. The temperature inside the reaction chamber is elevated to a desired temperature. This operation may be carried out under a high vacuum less than $10^{-7}$ torr without introducing gas at all, or performed while supplying gas of high purity. Thereafter, a raw material gas is allowed into the reaction chamber to deposit a film. After the end of the deposition, the reaction chamber is pumped or purged by nitrogen. Then, the operation of the turbomolecular pump is stopped, and the gate valve 1304 is closed. An inert gas such as nitrogen is admitted into the reaction chamber. After the pressure is returned to a given pressure such as atmospheric pressure, subsequently, the substrates are taken out.

Where the magnetic bearing turbomolecular pump of Example 9 is used as the turbomolecular pump 106, the effective pumping speed Se near the substrates inside the reaction chamber is equal to the pumping speed Sp of the pump, because the intake holes of the pump face the substrates. The pumping speed becomes its maximum value and is given $$Se=Sp=2200 \text{ l/sec}$$

Thus, when nitrogen was supplied into the reaction chamber at about 100 SCCM, the equilibrium pressure inside the reaction chamber was $6.9 \times 10^{-4}$ torr. In this way, deposition at an extremely low pressure is enabled. This pressure is still lower than the pressure used in Example 9. Therefore, a silicon film of high quality can be obtained at a lower temperature. Also, a thin-film semiconductor device having excellent characteristics can be stably fabricated by a low-temperature process.

Furthermore, in accordance with the present invention, the pressure inside the reaction chamber is adjusted according to the pressure in the exhaust port of the turbomolecular pump. Therefore the deposition pressure can be set in a very wide range. For example, when the flow rate of the raw material gas is 100 SCCM, the pressure inside the reaction chamber can be set to any desired value within a wide range from the above-described $6.9 \times 10^{-4}$ torr to 1.6 torr. Thus, various films can be deposited by the single CVD apparatus.

As described thus far, in accordance with the present invention, a semiconductor film such as a silicon film is deposited either by an LPCVD apparatus whose effective pumping speed in the reaction chamber is in excess of 10 SCCM/mtorr or by an LPCVD apparatus which makes the pressure inside the reaction chamber less than $10^{-5}$ torr within 10 minutes after the vacuum-pumping machine is operated in a steady condition. This greatly improves the semiconductor film, which, in turn, greatly improves the characteristics of the thin-film semiconductor device. Hence, a reduction in the manufacturing time and stable mass-production are accomplished. Furthermore, the present invention lowers the temperature at which a crystalline silicon film is formed by about 40 degrees compared with the prior art techniques. In addition, a conductive silicon film can be formed at a lower temperature. Thus, where the present invention is applied to an active-matrix liquid crystal display or the like, inexpensive glass sheets or plates can be used as substrates. Where the invention is applied to other electronic devices, deteriorations of the devices due to heat are reduced. Further, the novel CVD apparatus can form films in a much wider range of pressures than conventional. Various films can be produced by the single CVD apparatus. In this manner, the present invention improves the performance of active-matrix liquid crystal displays and the performance of electronic devices such as integrated circuits and reduces the costs.

As described thus far, the present invention is adequate for a method of forming semiconductor films such as silicon films used in thin-film semiconductor devices, integrated circuits, solar cells, charge-coupled devices, etc. Also, the invention is adequate for a low-pressure chemical vapor deposition (LPCVD) apparatus used to form semiconductor films. Furthermore, the invention is adequate for thin-film semiconductor devices using semiconductor films and applied to active-liquid crystal displays or the like.

I claim:

1. A hot-wall, low pressure chemical vapor deposition apparatus, comprising a reaction chamber and an evacuation pump system operatively attached to said reaction chamber, a gas injection pipe outlet and an intake of said evacuation pump system being located relative to each other to reduce turbulent flow of gases over substrates placed on a turntable located in said apparatus, said turntable turning during a deposition process, said evacuation pump system pumping gases through said reaction chamber at a pressure of less than 2 mtorr, said gases flowing through said reaction chamber at a pumping speed in excess of 10 SCCM/mtorr of pressure maintained in said reaction chamber during a deposition process.

2. A hot-wall, low pressure chemical vapor deposition apparatus, comprising a single-piece reaction chamber and a vacuum-pumping machine, said vacuum-pumping machine directly coupled to an opening of said single-piece reaction chamber via only a valve, wherein said vacuum-pumping machine directly evacuates gases from said reaction chamber through said valve without said gases passing through any conduits other than said valve.

3. A method of forming a semiconductor film on a surface of a substrate, at least the surface of the substrate comprising an insulating material, said method comprising the step of:

depositing the semiconductor film on said substrate surface in a reaction chamber by hot-wall, low-pressure chemical vapor deposition while using an evacuation pump system to pump gases through said reaction chamber at a low pressure of less than 2 mtorr, said gases being injected from a gas injection pipe and removed by said evacuation pump system so that the gases are flowing through said reaction chamber at a pumping speed in excess of 10 SCCM/mtorr of pressure maintained in said reaction chamber during a deposition process.

4. A method of forming a semiconductor film as set forth in claim 3, wherein the deposited semiconductor film includes silicon.

5. A method of fabricating a thin-film semiconductor device having a substrate and a semiconductor film formed on a surface of the substrate, the semiconductor film used as an active layer of a transistor, at least the surface of the substrate comprising an insulating material, said method comprising the step of:

depositing the semiconductor film on said substrate surface in a reaction chamber by hot-wall, low-pressure chemical vapor deposition using an evacuation pump system to pump gases through said reaction chamber at a low pressure of less than 2 mtorr, said gases being injected from a gas injection pipe and removed by said evacuation pump system so that the gases are flowing through said reaction chamber at a pumping speed in excess of 10 SCCM/mtorr of pressure maintained in said reaction chamber during a deposition process.

6. A method of fabricating a thin-film semiconductor device as set forth in claim 5, wherein the deposited semiconductor film includes silicon.

7. A hot-wall, low pressure chemical vapor deposition apparatus comprising a hot-wall reaction chamber and an evacuation pump system operatively attached to said reaction chamber, a gas injection pipe outlet and an intake of said evacuation pump system being located relative to each other to reduce turbulent flow of gases over substrates placed on a turntable located in said apparatus, said turntable turning during a deposition process, said evacuation pump system capable of attaining a base pressure less than $10^{-5}$ torr in said reaction chamber and pumping gases through the reaction chamber at a low pressure of less than 2 mtorr at a pumping speed at the reaction chamber in excess of 10 SCCM/mtorr of pressure maintained in said reaction chamber during a deposition process.

8. A method of forming a semiconductor film on a surface of a substrate, at least the surface of the substrate being made of an insulating material, said method comprising the step of:

depositing the semiconductor film on said substrate surface in a hot-wall reaction chamber using hot-wall low-pressure chemical vapor deposition during which a base pressure less than $10^{-5}$ torr is attained in said hot-wall reaction chamber and pumping gases through the reaction chamber at a low pressure of less than 2 mtorr, said gases being injected from a gas injection pipe and removed by an evacuation pump system so that the gases are flowing through said reaction chamber at a pumping speed at the reaction chamber in excess of 10 SCCM/mtorr of pressure maintained in said reaction chamber during a deposition process.

9. A method of forming a semiconductor film as set forth in claim 8, wherein the deposited semiconductor film includes silicon.

10. A method of fabricating a thin-film semiconductor device having a substrate and a semiconductor film formed on a surface of the substrate that is used as an active layer of a transistor, at least the surface of the substrate being made of an insulating material, said method comprising the step of:

depositing the semiconductor film on said substrate surface in a hot-wall reaction chamber using hot-wall, low-pressure chemical vapor deposition during which a base pressure less than $10^{-5}$ torr is attained in said hot-wall reaction chamber and pumping gases through the reaction chamber at a low pressure of less than 2 mtorr, said gases being injected from a gas injection pipe and removed by an evacuation pump system so that the gases are flowing through said reaction chamber at a pumping speed at the reaction chamber in excess of 10 SCCM/mtorr of pressure maintained in said reaction chamber during a deposition process.

11. A method of fabricating a thin-film semiconductor device as set forth in claim 10, wherein the deposited semiconductor film includes silicon.

12. A hot-wall, low pressure chemical vapor deposition apparatus, comprising:

a hot-wall reaction chamber; and an evacuation pump system operatively attached to said hot-wall reaction chamber;

a vacuum valve between said hot-wall reaction chamber and said evacuation pump system, said evacuation pump system capable of reducing the base pressure inside the hot-wall reaction chamber to less than $10^{-5}$ torr within 10 minutes during a deposition process after one of said evacuation pump system operates at a steady state and a vacuum valve between said hot-wall reaction chamber and said evacuation pump system is opened.

13. A method of forming a semiconductor film on a surface of a substrate, at least the surface of the substrate comprising an insulating material, said method comprising the step of:

depositing the semiconductor film on said substrate surface in a hot-wall reaction chamber using a hot-wall, low-pressure chemical vapor deposition process, wherein a base pressure inside the hot-wall reaction chamber is reduced to less than $10^{-5}$ torr within 10 minutes during the deposition process after one of an evacuation pump system operatively attached to the hot-wall reaction chamber operates at a steady state and a vacuum valve between said hot-wall reaction chamber and said pump system is opened.

14. A method of forming a semiconductor film as set forth in claim 13, wherein the deposited semiconductor film includes silicon.

15. A method of fabricating a thin-film semiconductor device having a substrate and a semiconductor film formed on a surface of the substrate used as an active layer of a transistor, at least the surface of the substrate comprising an insulating material, said method comprising the step of:

depositing the semiconductor film on said substrate surface in a hot-wall reaction chamber using a hot-wall low-pressure chemical vapor deposition process, wherein a base pressure inside the hot-wall reaction chamber is reduced to less than $10^{-5}$ torr within 10 minutes during the deposition process after one of an evacuation pump system operatively attached to the hot-wall reaction chamber operates at a steady state and a vacuum valve between said hot-wall reaction chamber and said evacuation pump system is opened.

16. A method of fabricating a thin-film semiconductor device as set forth in claim 15, wherein the deposited semiconductor film includes silicon.

17. A method of forming a semiconductor film containing silicon on a surface of a substrate, at least the surface of the substrate comprising an insulating material, said method comprising the step of:

depositing the semiconductor film in a hot-wall reaction chamber using a hot-wall, low-pressure chemical vapor deposition process and an evacuation pump system to pump gases through said reaction chamber, a gas injection pipe outlet and an intake of said evacuation pump system being located relative to each other to reduce turbulent flow of gases over substrates placed on a turntable located in said apparatus, said turntable turning during a deposition process, said gases flowing through said reaction chamber at a pumping speed in excess of 10 SCCM/mtorr, wherein during the deposition process monosilane ($SiH_4$) is used as a raw material gas and one of a pressure inside the hot-wall reaction chamber is less than 2 mtorr and a partial pressure of silane is less than 1 mtorr.

18. A method of fabricating a thin-film semiconductor device having a substrate and a semiconductor film containing silicon, the semiconductor film formed on a surface of the substrate and used as an active layer of a transistor, at least the surface of the substrate comprising an insulating material, said method comprising the step of:

depositing the semiconductor film in a hot-wall reaction chamber using a hot-wall, low-pressure chemical vapor deposition process and an evacuation pump system to pump gases through said reaction chamber, said gases being injected from a gas injection pipe and removed by said evacuation pump system so that the gases are flowing through said reaction chamber at a pumping speed in excess of 10 SCCM/mtorr, wherein during the deposition process, monosilane ($SiH_4$) is used as a raw material gas and one of a pressure inside the hot-wall reaction chamber is less than 2 mtorr and a partial pressure of silane is less than 1 mtorr.

19. A method of forming a semiconductor film on a surface of a substrate, at least the surface of the substrate comprising an insulating material, the semiconductor film containing dopant atoms, said method comprising the steps of:

depositing an intrinsic semiconductor film on said substrate surface in a hot-wall reaction chamber by hot-wall, low-pressure chemical vapor deposition while using an evacuation pump system that pumps gases through said reaction chamber at a low pressure of less than 2 mtorr, said gases being injected from a gas injection pipe and removed by said evacuation pump system so that the gases are flowing through said reaction chamber at a pumping speed in excess of 10 SCCM/mtorr of pressure maintained in said reaction chamber during a deposition process and using monosilane ($SiH_4$) as a raw material gas; and implanting dopant atoms into the intrinsic semiconductor film using a non-mass-separated ion implanter while using hydride of the added dopant and hydrogen as raw material gases.

20. The hot-wall, low pressure chemical vapor deposition apparatus of claim 1 comprising a reaction chamber and an evacuation pump system operatively attached to said reaction chamber, said pump system pumping gases through said reaction chamber at a reduced pressure of less than 2 mtorr and at a pumping speed in excess of 1650 l/sec during a deposition process.

21. A method of fabricating a thin-film semiconductor device having a substrate and a semiconductor film containing silicon, the semiconductor film formed on a surface of the substrate, the semiconductor film being used as an active layer of a transistor, at least the surface of the substrate comprising an insulating material, said method comprising the steps of:

depositing the semiconductor film on the insulating material while using monosilane ($SiH_4$) as a raw material gas in a reaction chamber and using a hot-wall, low-pressure chemical vapor deposition process, the deposition process having an evacuation pump system that pumps gases through said reaction chamber at a low pressure of less than 2 mtorr, said gases being injected from a gas injection pipe and removed by said evacuation pump system so that the gases are flowing at a pumping speed inside the reaction chamber in excess of 10 SCCM/mtorr of pressure maintained in said reaction chamber during the deposition process;

patterning the semiconductor film;

forming a gate-insulating film on the semiconductor film;

forming gate electrodes on the gate-insulating film; and implanting dopant atoms into portions of the semiconductor film which become source and drain regions using a non-mass-separated ion implanter while using hydride of the added dopant and hydrogen as raw material gases.

22. A hot-wall, low-pressure chemical vapor deposition apparatus comprising:

a reaction chamber;

a vacuum-pumping machine; and a manifold connecting the reaction chamber with the vacuum-pumping machine, the manifold including a top hole and a bottom hole coaxially aligned for inserting and removing substrates from the reaction chamber, the vacuum-pumping machine directly attached to the manifold at a position spaced from the top and bottom holes so that the substrates can be inserted and removed from the reaction chamber through the manifold without removing the vacuum-pumping machine or the reaction chamber, wherein a flow conductance between the reaction chamber and the manifold is larger than a pumping speed of the vacuum-pumping machine.

23. A hot-wall, low-pressure chemical vapor deposition apparatus comprising:

a reaction chamber;

a vacuum-pumping machine; and a manifold connecting the reaction chamber with the vacuum-pumping machine, the vacuum-pumping machine directly mounted onto the manifold such that substrates can be inserted and removed from the reaction chamber without removing the vacuum-pumping machine or the reaction chamber, wherein a flow conductance of the manifold is larger than a pumping speed of the vacuum-pumping machine.

24. A hot-wall, low-pressure chemical vapor deposition apparatus comprising:

a reaction chamber;

a vacuum-pumping machine; and a manifold connecting the reaction chamber with the vacuum-pumping machine, the manifold including a top hole, a bottom hole and a third hole, the top hole and the bottom hole coaxially aligned for inserting and removing substrates from the reaction chamber, the third hole being directly coupled to gas intake holes of the vacuum-pumping machine such that substrates can be inserted and removed from the reaction chamber without removing the vacuum-pumping machine or the reaction chamber, wherein a cross-sectional area of a narrowest portion of the manifold through which discharged gas passes is larger than a cross-sectional area of the gas intake holes in the vacuum-pumping machine.

25. A vertical, hot-wall, low-pressure chemical vapor deposition apparatus comprising a reaction chamber and a vacuum-pumping machine, the reaction chamber including gas injection holes for permitting introduction of gas into the reaction chamber, the gas injection holes being located at a lower position in a first end of the reaction chamber, the vacuum-pumping machine being at least partially mounted at a top of the reaction chamber, opposite from said first end and in fluid-wise communication with the top of the reaction chamber to remove gas through the top of the reaction chamber.

26. The vertical hot-wall, low-pressure chemical vapor deposition apparatus of claim 25, wherein said vacuum-pumping machine includes a turbomolecular pump.

27. A vertical, hot-wall, low-pressure chemical vapor deposition apparatus comprising a reaction chamber and a magnetic bearing turbomolecular pump, the reaction chamber including gas injection holes for permitting introduction of gas into the reaction chamber, the gas injection holes being located at a lower position at a first end in the reaction chamber, the magnetic bearing turbomolecular pump being mounted to a top of the reaction chamber opposite said first end and in fluid-wise communication with the top of the reaction chamber to remove gas through the top of the reaction chamber.

28. A hot-wall, low pressure chemical vapor deposition apparatus, comprising:

a reaction chamber;

a turbomolecular pump;

a second vacuum pump connected with an exhaust outlet of the turbomolecular pump; and a pressure adjuster located between the turbomolecular pump and the second vacuum pump, said pressure adjuster incrementally adjusting a pressure inside the reaction chamber by incrementally adjusting a pressure in the exhaust outlet of the turbomolecular pump, the turbomolecular pump being directly mounted to an opening of the reaction chamber.

29. A hot-wall, low pressure chemical vapor deposition apparatus comprising a single-piece reaction chamber, a turbomolecular pump, a gate valve, a second vacuum pump connected with the exhaust hole of the turbomolecular pump, the turbomolecular pump being directly mounted to an opening of the single-piece reaction chamber, the gate valve being mounted between the turbomolecular pump and the second vacuum pump.

30. The chemical vapor deposition apparatus of claim 29, further comprising a pressure adjuster which adjusts a pressure inside the reaction chamber located between the gate valve and the second vacuum pump.

31. The vertical hot-wall, low-pressure chemical vapor deposition apparatus of claim 25, wherein said vacuum-pumping machine is totally mounted at the top of said reaction chamber.

32. The vertical hot-wall, low-pressure chemical vapor deposition apparatus of claim 27, wherein said magnetic bearing turbomolecular pump is mounted directly to the top of said reaction chamber.

33. The vertical hot-wall, low-pressure chemical vapor deposition apparatus of claim 27, further comprising a valve between said magnetic bearing turbomolecular pump and the top of said reaction chamber.

* * * * *